(12) United States Patent
Li et al.

(10) Patent No.: US 10,734,610 B2
(45) Date of Patent: Aug. 4, 2020

(54) ORGANIC ELECTROLUMINESCENT DEVICE

(75) Inventors: Jingbo Li, Kanagawa (JP); Shinichiro Sonoda, Kanagawa (JP)

(73) Assignee: UDC IRELAND LIMITED, Dublin (IE)

( * ) Notice: Subject to any disclaimer, the term of this patent is extended or adjusted under 35 U.S.C. 154(b) by 0 days.

(21) Appl. No.: 13/997,494

(22) PCT Filed: Dec. 21, 2011

(86) PCT No.: PCT/JP2011/079650
§ 371 (c)(1),
(2), (4) Date: Nov. 12, 2013

(87) PCT Pub. No.: WO2012/090822
PCT Pub. Date: Jul. 5, 2012

(65) Prior Publication Data
US 2014/0054572 A1    Feb. 27, 2014

(30) Foreign Application Priority Data
Dec. 28, 2010  (JP) ................. 2010-293934

(51) Int. Cl.
*H01L 51/52* (2006.01)
*H05B 33/12* (2006.01)
*H01L 51/00* (2006.01)

(52) U.S. Cl.
CPC ...... *H01L 51/5268* (2013.01); *H01L 51/5271* (2013.01); *H01L 51/5275* (2013.01);
(Continued)

(58) Field of Classification Search
CPC ............. H01L 51/5268; H01L 51/5271; H01L 51/0545; H01L 51/0036; H01L 51/5012
(Continued)

(56) References Cited

U.S. PATENT DOCUMENTS 6,306,559 B1   10/2001  Tanamura et al.
6,469,438 B2   10/2002  Fukuoka et al.
(Continued)

FOREIGN PATENT DOCUMENTS

EP   1722604   11/2006
EP   1737276    6/2008
(Continued)

OTHER PUBLICATIONS

Pioneer R&D vol. 11 No. 1, pp. 21-28.

*Primary Examiner* — Nduka E Ojeh
(74) *Attorney, Agent, or Firm* — Riverside Law LLP

(57) ABSTRACT

[Problem] To provide an organic electroluminescent device that is excellent in external extraction efficiency of emitted light and able to attain reduced power consumption and prolonged service life.
[Solution] An organic electroluminescent device including, in an order mentioned: a reflective electrode; an organic electroluminescent layer; a transparent substrate; and a light-extracting unit, wherein the light-extracting unit contains a light-extracting member and a light distribution-converting member. In one preferable embodiment, the light-extracting member and the light distribution-converting member are each a prism, a prism array, a lens, a lens array, a fine concavo-convex structure or a fine particle layer.

20 Claims, 16 Drawing Sheets

(52) U.S. Cl.
CPC .......... *H05B 33/12* (2013.01); *H01L 51/0072* (2013.01); *H01L 51/0081* (2013.01); *H01L 51/0087* (2013.01)

(58) Field of Classification Search
USPC .......... 313/110–117, 483–522; 257/79–103, 257/40–47, E21, E33, E51; 353/28–51, 353/121; 428/690
See application file for complete search history.

(56) References Cited

U.S. PATENT DOCUMENTS

| | | | |
|---|---|---|---|
| 2004/0212296 A1* | 10/2004 | Nakamura | H01L 51/5036 313/504 |
| 2005/0142379 A1* | 6/2005 | Juni | G02B 5/0242 428/690 |
| 2005/0142976 A1 | 6/2005 | Suzuki | |
| 2005/0248929 A1 | 11/2005 | Kawamura et al. | |
| 2006/0063351 A1 | 3/2006 | Jain | |
| 2007/0015429 A1 | 1/2007 | Maeda et al. | |
| 2007/0121227 A1* | 5/2007 | Wang | G02B 5/0231 359/831 |
| 2007/0171671 A1* | 7/2007 | Kurokawa | B32B 3/30 362/606 |
| 2008/0218063 A1* | 9/2008 | Greiner | 313/504 |
| 2009/0051276 A1* | 2/2009 | Inoue | B82Y 20/00 313/504 |
| 2009/0051278 A1* | 2/2009 | Saneto et al. | 313/504 |
| 2009/0115970 A1* | 5/2009 | Morejon et al. | 353/38 |
| 2009/0215354 A1 | 8/2009 | Maeda et al. | |
| 2009/0243477 A1* | 10/2009 | Saneto | B82Y 20/00 313/504 |
| 2010/0103351 A1* | 4/2010 | Han | G02B 5/045 349/65 |
| 2012/0224382 A1* | 9/2012 | Petersohn | G02B 6/0051 362/471 |
| 2014/0054567 A1* | 2/2014 | Li | H01L 51/5262 257/40 |

FOREIGN PATENT DOCUMENTS

| | | |
|---|---|---|
| EP | 2159843 | 3/2010 |
| JP | 2001-203074 | 7/2001 |
| JP | 2003-059642 | 2/2003 |
| JP | 2003086353 | 3/2003 |
| JP | 2004-513484 | 4/2004 |
| JP | 2004-259606 | 9/2004 |
| JP | 2004-296423 | 10/2004 |
| JP | 2004-296429 | 10/2004 |
| JP | 2005327689 | 11/2005 |
| JP | 2006-269329 | 10/2006 |
| JP | 2007-503093 | 2/2007 |
| JP | 2010-147337 | 7/2010 |
| JP | 2010-205513 | 9/2010 |
| JP | 2010-205514 | 9/2010 |
| JP | 2010-212204 | 9/2010 |
| WO | 2005/020344 | 3/2005 |

* cited by examiner

ORGANIC ELECTROLUMINESCENT DEVICE

CROSS-REFERENCE TO RELATED APPLICATIONS

The present U.S. patent application is a National Stage Entry of International Patent Application No. PCT/JP2011/079650, filed 21 Dec. 2011, which claims priority benefit from Japanese Patent Appl. No. 2010-293934, filed 28 Dec. 2010, all of which are incorporated by reference herein in their entireties.

TECHNICAL FIELD

The present invention relates to an organic electroluminescent device (hereinafter may be referred to as, for example, "organic EL device" and "organic electroluminescence device").

BACKGROUND ART

Organic electroluminescent devices are self-emission type display devices and are expected for use in displays and lights. Organic electroluminescent displays have advantageous display performances such as higher visibility than conventional CRTs and LCDs, and no viewing angle dependency. Organic electroluminescent displays also have an advantage that they can be made lighter and thinner. Meanwhile, organic electroluminescent lights can be advantageously lighter and thinner and also, using a flexible substrate, organic electroluminescent lights may have a shape conventional lights cannot have.

An organic electroluminescent layer of an organic electroluminescent device has a multi-layered structure containing a light-emitting layer, a transparent electrode and other layers. Therefore, when light is emitted at an angle equal to or higher than a critical angle determined based on the refractive index of the organic electroluminescent layer and the refractive index of a medium into which the light is to be emitted, the light cannot be emitted to the air, totally reflected, and confined in the interior of the organic electroluminescent layer, so that the light is lost. According to calculation based on the classical Snell's law of refraction, when the refractive index n of the organic electroluminescent layer is 1.8 (the refractive index n of the organic electroluminescent layer is 1.7 to 1.85 according to NPL 1) and the distribution of light emitted from the organic electroluminescent layer is a Lambertian distribution, the light extraction efficiency of the light emitted to the air is about 30% due to the difference between the refractive index of the organic electroluminescent layer and the refractive index of the air. The remaining light accounting for about 70% cannot be emitted to the air since it is confined in the interior of the organic electroluminescent layer due to this difference in refractive index.

Solving the above problems to improve the light extraction efficiency requires preventing the above-described total reflection. In the process through which light emitted from the organic electroluminescent layer reaches the air, an angle of finally emitted light is determined by the difference between the refractive index of the organic electroluminescent layer and the refractive index of the air which is the lowest, so that the light extraction efficiency of the finally emitted light is determined. However, the totally reflected light in the organic electroluminescent device is energy-distributed by the refractive index of each layer of the organic electroluminescent device. For example, as illustrated in FIGS. 1A to 1D, the place where light is totally reflected when reaching air is varied with the relationship between the refractive index of each layer of the organic electroluminescent device and the refractive index of the organic electroluminescent device.

In the organic electroluminescent devices illustrated in FIGS. 1A to 1D, a first light-transmitting layer 105 is a transparent substrate, and a second light-transmitting layer 104 is a layer made of, for example, an adhesive and may be a protective layer.

As illustrated in FIG. 1A, no total reflection occurs between the organic electroluminescent layer 102 and the transparent electrode 103 since the refractive index (ne1) of the organic electroluminescent layer 102 is 1.8 and the refractive index (n3) of the transparent electrode 103 (e.g., an ITO electrode) is about 2.0. Also, the refractive index (n1) of the first light-transmitting layer 105 and the refractive index (n2) of the second light-transmitting layer 104 are lower than the refractive index (ne1) of the organic electroluminescent layer 102. When an outer layer is lower in refractive index than an inner layer in this manner, total reflection occurs at all the interfaces of the adjacent layers to the first light-transmitting layer 104 and the second light-transmitting layer 105.

Also, as illustrated in FIGS. 1B and 1C, when the refractive index of one of the first light-transmitting layer 105 and the second light-transmitting layer 104 is lower than the refractive index of the organic electroluminescent layer 102, the organic electroluminescent device has two or more interfaces where total reflection occurs.

Therefore, in order to improve light extraction efficiency in the organic electroluminescent devices illustrated in FIGS. 1A, 1B and 1C, a light-extracting unit has to be provided on each of the interfaces where total reflection occurs, and even providing a light-extracting unit only one interface of the interfaces where total reflection occurs is not enough to extract totally reflected light. Providing many light-extracting units is expected to require optimal design of light-extracting units and an organic electroluminescent device, which leads to complicated production process and cost elevation. When light-extracting units are provided on different places, the total efficiency of the light-extracting units is a product of the efficiencies of the light-extracting units. Meanwhile, since the light-extracting unit cannot extract all incident lights including totally reflected light and achieve 100% or 100% or more of the light extraction efficiency, the light extraction efficiency of the organic electroluminescent device is extracted to be lower as the number of the light-extracting units is greater. Also, in providing the light-extracting units, the interfaces where total reflection occurs newly arise unless consideration is made on the relative relationship between the refractive index of each light-extracting unit and the refractive index of the organic electroluminescent layer.

In FIG. 1D, when the refractive indices of the first light-transmitting layer 105 and the second light-transmitting layer 104 are higher than the refractive index of the organic electroluminescent layer 102, light emitted from the organic electroluminescent layer 102 all enters the first light-transmitting layer 105 adjacent to the air. Thus, its light extraction efficiency can be improved by providing a light-extracting unit between the first light-transmitting layer and the air. Also, by optimizing the light-extracting unit, high light extraction efficiency is expected to be obtained.

Furthermore, in order to avoid total reflection of light due to the difference in refractive index between the organic electroluminescent layer and the air to improve light extraction efficiency, there have been proposed various light-extracting units such as a lens, a lens array, a prism, a prism array, a fine concavo-convex structure and a fine particle layer. However, these improvements in the light-extracting unit do not have sufficient effects of improving the light extraction efficiency.

FIGS. 2A to 2D each illustrate that light emitted from the organic electroluminescent layer enters the light-extracting unit and is extracted to the outside. Here, the refractive index of the organic electroluminescent layer is assumed to be equal to or higher than the refractive index of the light-extracting unit.

FIG. 2A illustrates a case where the light-extracting unit is a fine concavo-convex structure 106. In this case, among light emitted from the organic electroluminescent layer 102, light that is originally able to reach the air is converted at a certain rate to light that is unable to reach the air as well as light that is originally unable to reach the air is converted to light that is able to reach the air, depending on diffraction efficiencies based on the structure of the fine concavo-convex structure 106 and the wavelength and angle of the light entering the fine concavo-convex structure. The light that is still unable to reach the air even after conversion returns to the interior of the organic electroluminescent layer, hits the reflective electrode and re-enters the fine concavo-convex structure. Nevertheless, some light components are lost due to the finite size of the organic electroluminescent layer and to the absorption into, for example, each organic electroluminescent layer and the reflective electrode.

FIG. 2B illustrates a case where the light-extracting unit is a lens (lens array) 107. In this case, light entering the lens is converted in angle with the lens structure at a certain probability and as a result, some light components travel toward the air and other light components are reflected toward the organic electroluminescent device. In the case of a hemispherical lens, for example, almost all of the light components passing from the organic electroluminescent layer 102 through the center of the lens 107 or its vicinity can reach the air regardless of their angles. Meanwhile, the light components passing the edges of the lens or its vicinity are confined in the lens, reflected on the reflective electrode of the organic electroluminescent device, and re-enter the lens 107, so that some of them are emitted to the air. Although the lens allows more light components to be emitted to the air per one time as a result of avoidance of total reflection than in the fine concavo-convex structure, the lens has a similar problem of absorption to the fine concavo-convex structure and thus is unable to achieve an efficiency of 100%. Also, the light extraction efficiency depends on the structure of the lens and the light distribution of incident light.

FIG. 2C illustrates a case where the light-extracting unit is a prism (prism array) 108. In this case, light emitted from the organic electroluminescent layer 102 enters the prism 108 and is converted in light emission angle with characteristics such as an oblique angle of the slope of the prism and an apex angle of the prism. As a result, some light components reach the air and other light components return to the organic electroluminescent device. Similar to the case of the lens, there are light components having angles at which they cannot be emitted from the prism, and these light components are reflected on the reflective electrode of the organic electroluminescent device. Every time when light components that are not absorbed re-enters the prism 108, these light components are emitted to air at a certain rate, but a light extraction efficiency of 100% cannot be obtained similarly.

FIG. 2D illustrates a case where the light-extracting unit is a fine particle layer 109. In the fine particle layer 109, the fine particles scatter light entering the polymer due to the difference in refractive index between the fine particles and the polymer, determining scattering pattern and scattering efficiency of the light in accordance with the light distribution of the incident light and characteristics of the fine particles and the polymer. As a result, to-be-totally-reflected light that is originally unable to reach the air is converted to light that is able to reach the air. The light that is still unable to reach the air even after conversion returns to the interior of the organic electroluminescent layer 102, is reflected on the reflective electrode, and re-enters the fine particle layer, where it is scattered and emitted to the air at a certain scattering efficiency. However, it is inevitable to lose light similarly.

As discussed above, only use of various light-extracting units such as a lens, a lens array, a prism, a prism array, a fine concavo-convex structure and a fine particle layer cannot make sufficient improvement in light extraction efficiency. As is clear from the above discussion, the light distribution of light entering the light-extracting unit also influences the light extraction efficiency of the organic electroluminescent device. To speak of extremes, when energy of light entering the light-extracting unit concentrates on an optimal angle of the light-extracting unit, the light-extracting unit shows the maximum light extraction efficiency. Needless to say, although light emitted from the organic electroluminescent device cannot be at an extreme distribution, it is necessary to optimize the light distribution of light entering the light-extracting unit.

Meanwhile, analysis of interaction between light and the lens, lens array, prism, prism array, fine concavo-convex structure or fine particle layer indicates that when light is emitted from the organic electroluminescent layer to enter these structures and then is re-emitted from them, the light distribution of the light emitted to another medium is difference from the light distribution of the incident light; i.e., the original light distribution is converted with these structures. These structures can be used also as a light distribution-converting unit.

Here, care should be taken about the difference from another light distribution-converting unit in the fine particle layer. Specifically, since the fine concavo-convex structure, lens and prism use the difference in refractive index at the interfaces, the refractive index of a medium at the light-incident side cannot be equal to the refractive index of a medium at the light-emitted side. Also, in order to simply convert the light distribution to avoid total reflection, the refractive index at the light-incident side of the fine concavo-convex structure, lens, prism, etc. has to be equal to or higher than the refractive index of the organic electroluminescent layer and the refractive index of a medium at the light-emitted side has to be higher than the refractive index of a medium at the light-incident side.

The fine particle layer uses the difference in refractive index between the fine particles and the polymer and thus does not have the above limitations. The refractive index of the polymer at the light-emitted side may be equal to the refractive index of a medium at the light-incident side and the refractive index of the fine particles may be higher than the refractive index of the polymer. Therefore, there is no particular need to use a material having a higher refractive index than the organic electroluminescent layer. In addition, fine particles can be selected from a wide variety of fine particles, which gives a large degree of freedom to realization.

As already illustrated in FIGS. 2A to 2D, properly converting the light distribution of light emitted from the organic electroluminescent layer can lead to further improvement in light extraction efficiency. Preferably, the fine particle layer is used as a light distribution-converting member for light emitted from the organic electroluminescent layer, and fine structures such as a prism are used as a light-extracting member. Combining them can lead to further improvement in light extraction efficiency.

Any of the light-extracting units generates light that is changed in emission angle and returned to the interior of the organic electroluminescent device. In order to extract such light, the reflective electrode of the organic electroluminescent device is used to reflect and re-enter the light to the light-extracting unit. The reflectivity of the reflective electrode of the organic electroluminescent device greatly influences light extraction, which requires a reflective electrode having a high reflectivity relative to the organic electroluminescent layer.

Here, relevant prior art references disclose organic electroluminescent devices where a total reflection interface exists only at the interface with air considering the layer structure and the layer material, although PTLs 1 to 3 do not specifically describe them. PTLs 1 to 3 exemplify a fine particle layer, a lens and a prism as light-extracting units, but do not study at all synergistic effects for light extraction efficiency obtained combining a light distribution-converting unit or characteristics of each unit, especially scattering by fine particles (serving as a light distribution-converting unit), with another unit in order to obtain sufficient light extraction effects. In addition, studies on reflective electrode are not enough.

PTL 4 proposes an organic electroluminescent device where a volume diffuser (fine particle layer) and a microstructure (prism layer) are combined together. In this proposal, however, the fine particle layer and the prism layer are not adjacent to each other, and both of the layers are used as light-extracting units. Therefore, the organic electroluminescent device has a problem that the light extraction efficiency is low.

As described above, at present, there has not been provided an organic electroluminescent device that is excellent in external extraction efficiency of emitted light and able to attain reduced power consumption and prolonged service life.

CITATION LIST

Patent Literature

PTL 1: Japanese Patent Application Laid-Open (JP-A) No. 2004-296429
PTL 2: JP-A No. 2004-259606
PTL 3: JP-A No. 2003-59642
PTL 4: JP-A No. 2004-513484

Non-Patent Literature

NPL 1: PIONEER R&D Vol. 11 No. 1, pp. 21-28

SUMMARY OF INVENTION

Technical Problem

The present invention aims to solve the above problems in the art and achieve the following object. That is, an object of the present invention is to provide an organic electroluminescent device excellent in external extraction efficiency of emitted light and able to achieve reduced consumption power and long service life.

Solution to Problem

The present inventors conducted extensive studies to solve the above problems and improve light extraction efficiency of an organic electroluminescent device, and have found the following. Specifically, analysis of light distribution in an organic electroluminescent device indicates that there are light that is called "thin-film mode" and confined in an organic electroluminescent layer due to the difference in refractive index between a transparent electrode and a transparent substrate, and light that is called "substrate mode" and confined in a transparent substrate due to the difference in refractive index between the transparent substrate and the air. As a result, it is necessary to provide light-extracting units configured to avoid total reflection at a plurality of places in the organic electroluminescent device where total reflection occurs. Providing a plurality of light-extracting units in this way raises new problems of complicating optimization of the design of each light-extracting unit and its production process, and of elevating cost. Also, since each of the light-extracting units cannot extract all incident lights to achieve 100% of the light extraction efficiency, the total efficiency of the light-extracting units is a product of the efficiencies of the light-extracting units. Thus, the light extraction efficiency of the organic electroluminescent device is extracted to be lower as the number of the light-extracting units is greater. Also, in providing the light-extracting units, the interfaces where total reflection occurs newly arise unless consideration is made on the relative relationship between the refractive index of each light-extracting unit and the refractive index of the organic electroluminescent layer. Furthermore, there is a problem that the light distribution of light emitted from the organic electroluminescent layer is an optimum light distribution for each light-extracting unit.

In view of the above, in the present invention, it has been found that the following is quite advantageous in improving light extraction efficiency: it is preferable to make an organic electroluminescent device having such a configuration that the number of interfaces where total internal reflection occurs is one; the light-extracting units are provided collectively at one place in the organic electroluminescent device to avoid increasing the number of interfaces where total reflection occurs; and a united member of a light-extracting member and a light distribution-converting member is used as the light-extracting unit, preferably a fine particle layer is used as the light distribution-converting member and a prism array is used as the light-extracting member.

The present invention is based on the above finding obtained by the present inventors, and means for solving the above problems are as follows.

<1> An organic electroluminescent device including, in an order mentioned:
a reflective electrode;
an organic electroluminescent layer;
a transparent substrate; and
a light-extracting unit,
wherein the light-extracting unit contains a light-extracting member and a light distribution-converting member.
<2> The organic electroluminescent device according to <1>, wherein the light distribution-converting member is a prism, a prism array, a lens, a lens array, a fine concavo-convex structure or a fine particle layer.

<3> The organic electroluminescent device according to <1> or <2>, wherein the light distribution-converting member is a fine particle layer containing fine particles and a polymer.

<4> The organic electroluminescent device according to any one of <1> to <3>, wherein the light-extracting member is a prism, a prism array, a lens, a lens array, a fine concavo-convex structure or a fine particle layer.

<5> The organic electroluminescent device according to any one of <1> to <4>, wherein the light-extracting member is a prism or a prism array.

<6> The organic electroluminescent device according to any one of <1> to <5>, wherein the light-extracting member is a prism layer formed of a prism or of a prism array, and the light distribution-converting member is a fine particle layer containing fine particles and a polymer, and wherein the fine particle layer and the prism layer are provided on the transparent substrate in an order mentioned.

<7> The organic electroluminescent device according to any one of <1> to <5>, wherein the light-extracting member and the light distribution-converting member are united to be a united member of the light-extracting member and the light distribution-converting member.

<8> The organic electroluminescent device according to <7>, wherein the combination of the light-extracting member and the light distribution-converting member contains fine particles and a polymer in a prism layer formed of a prism or of a prism array.

<9> The organic electroluminescent device according to any one of <1> to <8>, wherein the number of interfaces where total internal reflection occurs is one.

<10> The organic electroluminescent device according to any one of <1> to <9>, wherein the reflective electrode is formed of silver.

Advantageous Effects of Invention

The present invention can provide an organic electroluminescent device excellent in external extraction efficiency of emitted light and able to achieve reduced consumption power and long service life. The organic electroluminescent device can solve the above existing problems in the art.

DESCRIPTION OF EMBODIMENTS

Figure 1A:
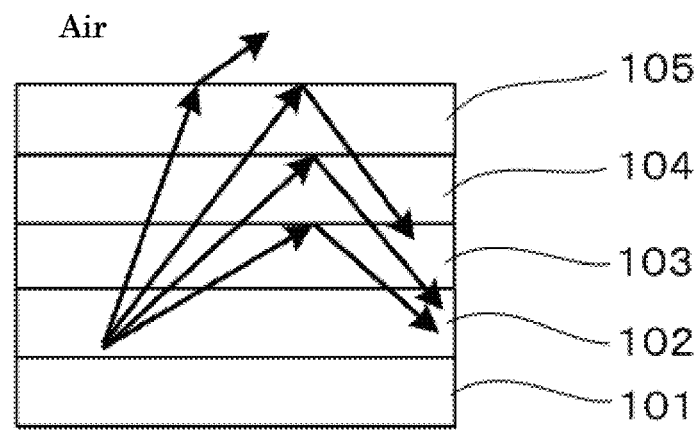
FIG. 1A is a schematic view of the relationship between reflection of light and refractive index of each layer of an organic electroluminescent device (part 1).
Figure 1B:
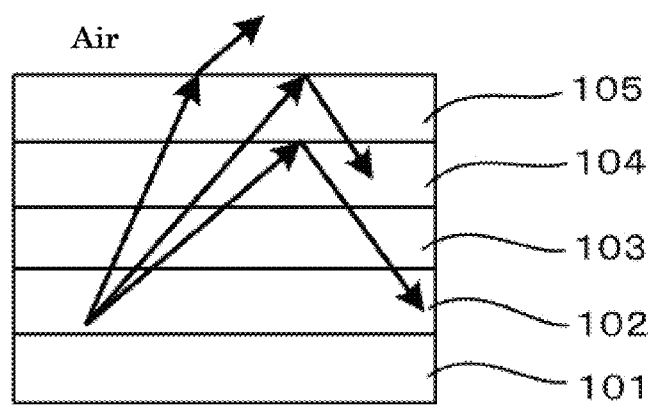
FIG. 1B is a schematic view of the relationship between reflection of light and refractive index of each layer of an organic electroluminescent device (part 2).
Figure 1C:
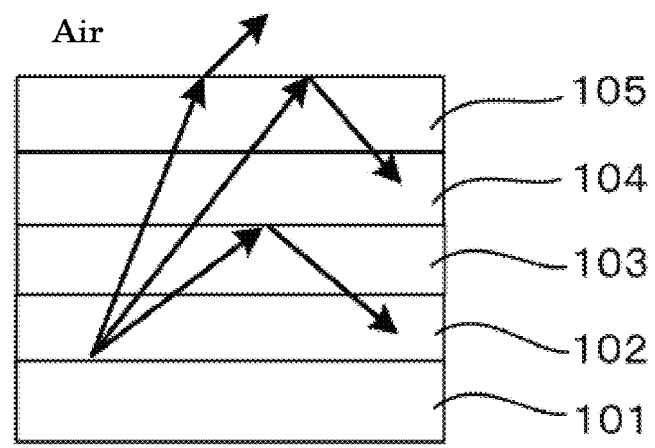
FIG. 1C is a schematic view of the relationship between reflection of light and refractive index of each layer of an organic electroluminescent device (part 3).
Figure 1D:
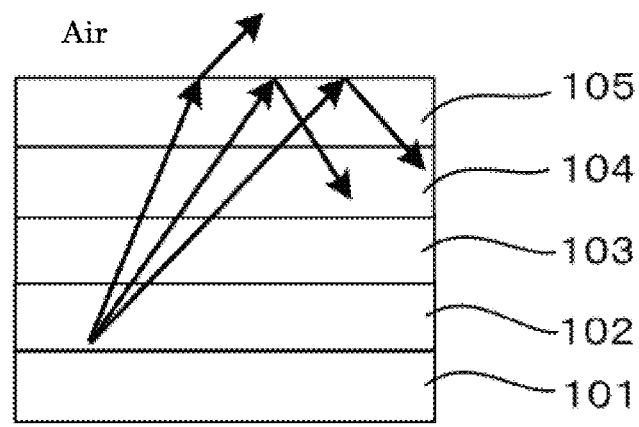
FIG. 1D is a schematic view of the relationship between reflection of light and refractive index of each layer of an organic electroluminescent device (part 4).
Figure 2A:
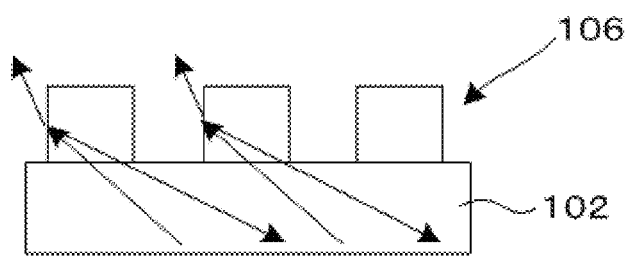
FIG. 2A illustrates behaviors of light emitted from an organic electroluminescent layer when a light-extracting unit is a fine concavo-convex structure.
Figure 2B:
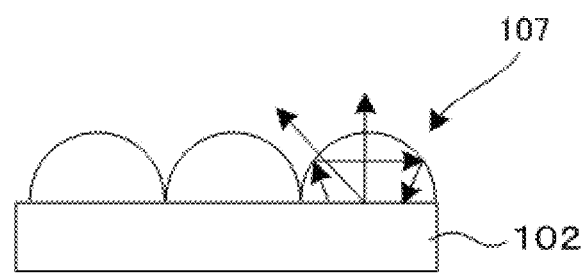
FIG. 2B illustrates behaviors of light emitted from an organic electroluminescent layer when a light-extracting unit is a lens layer (lens array).
Figure 2C:
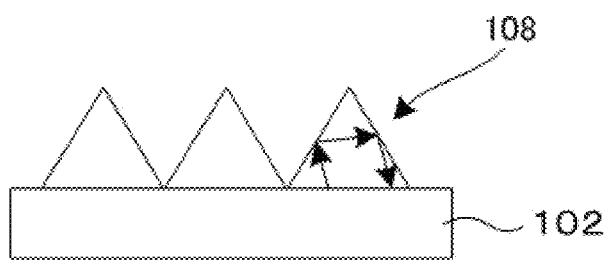
FIG. 2C illustrates behaviors of light emitted from an organic electroluminescent layer when a light-extracting unit is a prism layer (prism array).
Figure 2D:
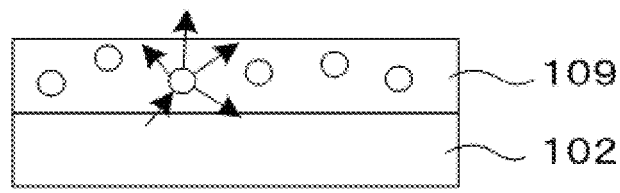
FIG. 2D illustrates behaviors of light emitted from an organic electroluminescent layer when a light-extracting unit is a fine particle layer.

An organic electroluminescent device of the present invention contains at least a reflective electrode, an organic electroluminescent layer, a transparent substrate and a light-extracting unit and in the order mentioned; and, if necessary, further contains other members.

The organic electroluminescent device is preferably of a bottom-emission type in which light emitted from the organic electroluminescent layer is emitted from the transparent substrate. In the case of the organic electroluminescent device of a top-emission type, materials for forming the device have to be transparent in the visible light region (wavelength range: 400 nm to 700 nm) in order for light emitted from the organic electroluminescent layer to transmit therethrough. Meanwhile, in the case of the organic electroluminescent device of a bottom-emission type, transparency of the materials for forming the device is not particularly required, and the following materials can widely be used: organic compounds such as silicone polymers, epoxy polymers, acryl polymers and urethane polymers; and inorganic compounds such as SiNx, SiON, $SiO_2$, $Al_2O_3$ and $TiO_2$. From the viewpoints of selectivity and cost of materials for forming the organic electroluminescent device, a bottom-emission type is particularly preferred.

<Light-Extracting Unit>

The light-extracting unit contains a light-extracting member and a light distribution-converting member.

<<Light Distribution-Converting Member>>

The light distribution-converting member is not particularly limited and may be appropriately selected depending on the intended purpose so long as it has a function of converting the distribution of light. For example, the light distribution-converting member is preferably a prism, a prism array (prism layer), a lens, a lens array (lens layer), a fine concavo-convex structure or a fine particle layer. Among them, a fine particle layer containing fine particles and a polymer is particularly preferred from the viewpoints of simplicity and degree of freedom in production of the light distribution-converting member as described above.

—Prism and Prism Array—

The prism is not particularly limited and may be appropriately selected depending on the intended purpose. For example, the prism is a unit prism where ridge lines extend in one direction and are arranged in another direction perpendicular to the one direction in parallel at predetermined intervals, or a unit prism of quadrangular pyramidal shape where ridge lines are arranged in lattice form.

The prism array (prism layer) can be formed by an imprint method. In one employable method, an imprint material is prepared by dispersing, in a UV imprint resin, $TiO_2$ ultra fine particles as ultra fine particles, and polystyrene scattering particles. Then, a silica mold the surface of which has been provided with a releasing agent is used to perform UV imprinting, whereby a prism array can be formed.

The prism height D is not particularly limited and may be appropriately selected depending on the intended purpose, but is preferably 0.05 mm to 1 mm.

The prism width W is not particularly limited and may be appropriately selected depending on the intended purpose, but is preferably 0.05 mm to 4 mm.

—Lens and Lens Array—

The lens array (lens layer) can be formed by an imprint method. In one employable method, an imprint material is prepared by dispersing, in a UV imprint resin, $TiO_2$ ultra fine particles as ultra fine particles, and polystyrene scattering particles. Then, a silica mold the surface of which has been provided with a releasing agent is used to perform UV imprinting, whereby a lens array can be formed.

The height of the lens T is not particularly limited and may be appropriately selected depending on the intended purpose, but is preferably 0.05 mm to 2 mm.

The diameter of the lens 2R is not particularly limited and may be appropriately selected depending on the intended purpose, but is preferably 0.1 mm to 2 mm.

—Fine Concavo-convex Structure—

The fine concavo-convex structure can be formed by an imprint method. In one employable method, an imprint material is prepared by dispersing, in a UV imprint resin, $TiO_2$ ultra fine particles as ultra fine particles, and polystyrene scattering particles. Then, a silica mold the surface of which has been provided with a releasing agent is used to perform UV imprinting. Next, the UV imprint resin is used to smooth the fine concavo-convex structure formed.

The height of the concave and convex portions h is not particularly limited and may be appropriately selected depending on the intended purpose, but is preferably 0.3 mm to 3 mm.

The width of the concave and convex portions d is not particularly limited and may be appropriately selected depending on the intended purpose, but is preferably 0.5 mm to 3 mm.

—Fine Particle Layer—

The fine particle layer contains at least a polymer and fine particles; and, if necessary, further contains other ingredients.

The refractive index of the polymer in the fine particle layer is preferably different from the refractive index of the fine particles.

In the case where the polymer whose refractive index is equal to or higher than the refractive index of the organic electroluminescent layer contains the fine particles whose refractive index is different from the refractive index of the polymer, every time light emitted toward the polymer from the organic electroluminescent layer hits the fine particles, the light is scattered due to the difference in refractive index between the polymer and the fine particles, so that the angle of the emitted light is changed. In this manner, when to-be-totally-reflected light emitted at higher angles are changed to light emitted at lower angles, the light is emitted to the air from the transparent substrate. Also, the light emitted at higher angles is scattered toward the reflective electrode, reflected on the reflective electrode, and re-enters the fine particle layer, where the angle of the emitted light is changed. Thus, it is preferable for the polymer to contain the fine particles whose refractive index is different from the polymer, from the viewpoint of improving the light extraction efficiency of the organic electroluminescent device.

—Fine Particles—

The fine particles are not particularly limited and may be appropriately selected depending on the intended purpose so long as they have a refractive index different from that of the polymer in the fine particle layer and can scatter light. The fine particles may be organic fine particles or inorganic fine particles. Preferably, two or more kinds of fine particles are contained in the fine particle layer.

Examples of the organic fine particles include polymethyl methacrylate beads, acryl-styrene copolymer beads, melamine beads, polycarbonate beads, polystyrene beads, crosslinked polystyrene beads, polyvinyl chloride beads and benzoguanamine.melamineformaldehyde beads.

Examples of the inorganic fine particles include $ZrO_2$, $TiO_2$, $Al_2O_3$, $In_2O_3$, $ZnO$, $SnO_2$ and $Sb_2O_3$. Among them, $TiO_2$, $ZrO_2$, $ZnO$ and $SnO_2$ are particularly preferred.

The refractive index of the fine particles is not particularly limited and may be appropriately selected depending on the intended purpose so long as it is different from the refractive index of the polymer in the fine particle layer. The refractive index of the fine particles is preferably 1.55 to 2.6, more preferably 1.58 to 2.1.

The refractive index of the fine particles can be measured in the following manner, for example. Specifically, an automated refractive index meter (KPR-2000, product of Shimadzu Corporation Ltd.) is used to measure the refractive index of a refractive index liquid, followed by measuring with a precision spectrometer (GMR-1DA, product of Shimadzu Corporation Ltd.) by the Shrivsky method.

The average particle diameter of the fine particles is preferably 0.5 µm to 10 µm, more preferably 0.5 µm to 6 µm. When the average particle diameter of the fine particles is more than 10 µm, such fine particles scatter most of light forward, so that they may be degraded in an ability to change the angle of light. Although light emitted at higher angles is returned to the organic electroluminescent layer, reflected on the reflective electrode, and re-enters the fine particle layer as described above, there may be a drop in light extraction efficiency due to the finite size of the organic electroluminescent device and to the absorption into the organic electroluminescent layer and the reflective electrode. Whereas when the average particle diameter of the fine particles is less than 0.5 µm, the average particle diameter thereof is less than the wavelengths of visible light and Mie scattering is changed to Rayleigh scattering, which increases the wavelength dependency of scattering efficiency of the fine particles to presumably cause a great change in chromaticity of the light-emitting element and a drop in light extraction efficiency.

The average particle diameter of the fine particles can be measured by, for example, a device using the dynamic light scattering method such as NANOTRACK UPA-EX150 (product of NIKKISO CO., LTD.) or image processing of their electron microscope image.

The filling rate by volume of the fine particles in the fine particle layer is preferably 20% to 70%, more preferably 30% to 65%. When the filling rate by volume thereof is less than 20%, there is low probability that the fine particles scatter light entering the fine particle layer, so that the fine particle layer has a low ability to change the angle of light. Thus, unless the thickness of the fine particle layer is sufficiently increased, there may be a drop in light extraction efficiency. Increasing the thickness of the fine particle layer may unfavorably lead to elevation of cost. In addition, back-scattered light increases to lead to a drop in light extraction efficiency. Whereas when the filling rate by volume thereof is more than 70%, the resultant state is almost the closest packing state, potentially making it difficult to control properties of the fine particle layer.

The filling rate by volume of the fine particles in the fine particle layer can be measured by, for example, a weight measuring method. First, the fine particles are measured for specific gravity using a particle specific gravity meter (MARK3, product of UNION ENGINERRING CO., LTD.) and then an electric balance (FZ-3000i, product of A&D Company, Ltd.) is used to measure the weight of the fine particles. Next, a part of the fine particle layer is cut out and the resultant cut section is observed under a scanning electron microscope (S-3400N, product of Hitachi High-Technologies Corporation) to measure the thickness of the fine particle layer. In this manner, the filling rate by volume of the fine particles in the fine particle layer can be determined.

<<Polymer>>

As described above, the refractive index of the polymer in the fine particle layer is equal to or higher than the refractive index of the organic electroluminescent layer and is preferably 1.55 to 1.95.

Such high-refractive-index polymers suitably used are high-refractive-index compositions in which the polymer is adjusted to exhibit a high refractive index using high-refractive-index fine particles having small particle diameters.

The high-refractive-index composition contains: the above fine particles; high-refractive-index fine particles having small particle diameters; and a matrix. If necessary, the high-refractive-index composition further contains a dispersing agent, a solvent, and other ingredients.

—High-Refractive-Index Fine Particles—

The refractive index of the high-refractive-index fine particles is preferably 1.8 to 2.8, more preferably 1.9 to 2.8. The average particle diameter of primary particles of the high-refractive-index fine particles is preferably 3 nm to 100 nm, more preferably 5 nm to 100 nm, still more preferably 10 nm to 80 nm.

When the refractive index of the high-refractive-index fine particles is 1.8 or higher, the refractive index of the fine particle layer can be increased effectively. When the refractive index of the high-refractive-index fine particles is 2.8 or lower, such high-refractive-index fine particles do not cause any inconveniences such as coloring of the particles, which is preferred. When the average particle diameter of primary particles of the high-refractive-index fine particles is 100 nm or less, such high-refractive-index fine particles do not cause any inconveniences such as impairment of transparency of the formed fine particle layer due to an increased haze thereof. When the average particle diameter of primary particles of the high-refractive-index fine particles is 3 nm or more, the refractive index is preferably kept high.

Here, the particle diameter of the high-refractive-index fine particles is expressed by an average primary particle diameter measured using a transmission electron microscope (TEM) image. The average primary particle diameter is expressed by an average of the maximum diameters of the fine particles. When each fine particle has a long-axis diameter and a short-axis diameter, the average primary particle diameter is expressed by an average of the long-axis diameters of the fine particles.

Examples of the high-refractive-index fine particles include particles containing as a main ingredient an oxide, a composite oxide or a sulfide of, for example, Ti, Zr, Ta, In, Nd, Sn, Sb, Zn, La, W, Ce, Nb, V, Sm and/or Y. Here, the main ingredient means an ingredient present in the largest amount (% by mass) among the constituent ingredients of the particles. More preferred high-refractive-index fine particles are particles containing as a main ingredient an oxide or a composite oxide containing at least one metal element selected from Ti, Zr, Ta, In and Sn.

The high-refractive-index fine particles may contain various elements therein (hereinafter such elements may be referred to as "contained elements").

Examples of the contained elements include Li, Si, Al, B, Ba, Co, Fe, Hg, Ag, Pt, Au, Cr, Bi, P and S. When tin oxide particles or indium oxide particles are used, it is preferable to incorporate the contained particles such as Sb, Nb, P, B, In, V and halogen atoms, in order to increase electrical conductivity of the particles. It is most preferable to incorporate antimony oxide in an amount of 5% by mass to 20% by mass.

Further examples of the high-refractive-index fine particles include inorganic fine particles containing titanium dioxide as a main ingredient and at least one element selected from Co, Zr and Al as a contained element (hereinafter such inorganic fine particles may be referred to as "specific oxide"). Among these contained elements, Co is particularly preferred.

The total amount of the Co, Al and Zr is preferably 0.05% by mass to 30% by mass, more preferably 0.1% by mass to 10% by mass, further preferably 0.2% by mass to 7% by mass, particularly preferably 0.3% by mass to 5% by mass, most preferably 0.5% by mass to 3% by mass, relative to the amount of Ti.

The contained elements Co, Al and Zr are present in the interior or the surface of the high-refractive-index fine particles containing titanium dioxide as a main ingredient. Preferably, they are present in the interior of the high-refractive-index fine particles containing titanium dioxide as a main ingredient. More preferably, they are present in both the interior and the surface thereof. Metal elements among these contained elements may exist in the form of oxides thereof.

Other preferred high-refractive-index fine particles are, for example, inorganic fine particles which are particles of a composite oxide formed of a titanium element and at least one metal element selected from metal elements whose oxides have a refractive index of 1.95 or higher (hereinafter this metal element may be abbreviated as "Met") where the composite oxide is doped with at least one kind of metal ions selected from Co ions, Zr ions and Al ions (hereinafter this composite oxide may be referred to as "specific composite oxide"). Here, examples of the metal elements whose oxides have a refractive index of 1.95 or higher include Ta, Zr, In, Nd, Sb, Sn and Bi. Among them, Ta, Zr, Sn and Bi are particularly preferred.

The amount of the metal ions with which the specific composite oxide is doped is preferably 25% by mass or less relative to the amount of all the metals forming the composite oxide; i.e., [Ti+Met], from the viewpoint of keeping its refractive index. It is more preferably 0.05% by mass to 10% by mass, further preferably 0.1% by mass to 5% by mass, particularly preferably 0.3% by mass to 3% by mass.

The doped metal ions may be present in the form of metal ions or metal atoms. They may appropriately be present from the surface to the interior of the composite oxide. Preferably, the doped metal ions are present in both the surface and the interior of the composite oxide.

The high-refractive-index fine particles each preferably have a crystalline structure. Preferably, the crystalline structure mainly has a rutile structure, a rutile/anatase mixed crystal, or an anatase structure. Particularly preferably, it mainly has a rutile structure. With this structure, the high-refractive-index fine particles of the specific oxide or the specific composite oxide result to have a refractive index of 1.9 to 2.8, which is preferred. The refractive index thereof is more preferably 2.1 to 2.8, further preferably 2.2 to 2.8. In addition, it is possible to prevent titanium dioxide from exerting its photocatalytic activity, which enables remarkable improvement in weatherability of the fine particle layer itself and of both the above and under layers in contact with the fine particle layer.

A method for doping the above specific metal atoms or metal ions may be a conventionally known method. Examples thereof include: methods described in, for example, JP-A Nos. 05-330825, 11-263620 and 11-512336 and Europe Patent Application No. 0335773; and ion implantation methods [described in, for example, "Ion Beam Applied Technology" edited by Shunichi Gonda, Junzo Ishikawa and Eiji Kamijo and published by CMC Publishing Co., Ltd. in 1989, Yasushi Aoki, "Surface Science" Vol. 18(5), p. 262, 1998, Masakazu Anpo et al., "Surface Science" Vol. 20(2), p. 60, 1999].

The high-refractive-index fine particles may be subjected to a surface treatment. The surface treatment is a treatment with which the surfaces of the particles are modified using an inorganic compound and/or an organic compound. The surface treatment can adjust wettability of the surfaces of the high-refractive-index fine particles to improve fine particle formation in an organic solvent as well as dispersibility and dispersion stability thereof in the high-refractive-index composition. Examples of the inorganic compound to be physicochemically adsorbed on the surfaces of the particles include silicon-containing inorganic compounds (e.g., $SiO_2$), aluminum-containing inorganic compounds [e.g., $Al_2O_3$ and $Al(OH)_3$], cobalt-containing inorganic compounds (e.g., $CoO_2$, $Co_2O_3$ and $Co_3O_4$), zirconium-containing inorganic compounds [e.g., $ZrO_2$ and $Zr(OH)_4$] and iron-containing inorganic compounds (e.g., $Fe_2O_3$).

The organic compound able to be used for the surface treatment may be a conventionally known surface modifying agent of inorganic fillers such as metal oxides and inorganic pigments. They are described in, for example, "Stabilization of Pigment Dispersion and Surface Treatment Technology-Evaluation," Chapter 1 (published by TECHNICAL INFORMATION INSTITUTE CO., LTD., 2001).

Specific examples of the organic compound used for the surface treatment include: organic compounds containing a polar group having affinity with the surfaces of the high-refractive-index fine particles; and coupling compounds. Examples of the polar group having affinity with the surfaces of the high-refractive-index fine particles include a carboxyl group, a phosphono group, a hydroxyl group, a mercapto group, cyclic acid anhydride groups and an amino group. The organic compounds are preferably compounds containing at least one kind of these groups in the molecules thereof. Examples of such compounds include long-chain aliphatic carboxylic acids (e.g., stearic acid, lauric acid, oleic acid, linoleic acid and linolenic acid) and polyol compounds (e.g., pentaerythritol triacrylate, dipentaerythritol pentaacrylate and ECH (epichlorohydrin)-modified glycerol triacrylate), phosphono group-containing compounds (e.g., EO (ethylene oxide)-modified phosphoric acid triacrylate) and alkanolamines (ethylene diamine EO adducts (5 mole)).

Examples of the coupling compounds include conventionally known organic metal compounds, including silane coupling agents, titanate coupling agents and aluminate coupling agents. Among them, silane coupling agents are particularly preferred. Specific examples thereof include compounds described in JP-A No. 2002-9908 and paragraphs [0011] to [0015] of JP-A No. 2001-310423. Two or more kinds of these compounds used for the surface treatment may be used in combination.

The high-refractive-index fine particles are also preferably fine particles having core-shell structures where the high-refractive-index fine particles serving as cores are provided with shells of another inorganic compound. The shell is preferably made of an oxide of at least one element selected from Al, Si and Zr. Specific examples thereof are described in, for example, JP-A No. 2001-166104.

The shape of each of the high-refractive-index fine particles is not particularly limited and may be appropriately selected depending on the intended purpose. For example, it is a rice shape, a spherical shape, a cubic shape, a spindle shape or an amorphous shape. Only one kind of the high-refractive-index fine particles may be used, or two or more kinds thereof may be used in combination.

The amount of the high-refractive-index fine particles is not particularly limited and may be appropriately selected depending on the intended purpose, but preferably falls within such a range that can make the refractive index of the polymer to be 1.55 to 1.95.

The matrix is preferably (A) an organic binder, (B) an organic metal compound containing a hydrolyzable functional group and a partially condensated product of the organic metal compound, or both of (A) and (B).

—(A) Organic Binder—

Examples of the (A) organic binder include binders formed from (1) conventionally known thermoplastic resins, (2) combinations of conventionally known reactive curable resins and curing agents, or (3) combinations of binder precursors (e.g., the below-described curable polyfunctional monomers or oligomers) and polymerization initiators.

The high-refractive-index composition is preferably prepared from a dispersion liquid containing: the organic binder formed from the above (1), (2) or (3); fine particles; and a dispersing agent. This composition is coated on a support and formed into a film, which is then cured by a method selected depending on the ingredient for forming the binder, to thereby form the fine particle layer. A method for curing the film may be appropriately selected depending on the kind of the ingredient for forming the binder, and examples thereof include a method of inducing crosslinking or polymerization reaction of curable compounds (e.g., polyfunctional monomers or oligomers) by means of heating, light application, or both thereof. Among them, preferred is a method where light is applied to the combinations in (3) above to allow the curable compounds to perform crosslinking or polymerization reaction so that the binder is formed.

Furthermore, it is preferable to allow the dispersing agent contained in the dispersion liquid of the fine particles to perform crosslinking or polymerization reaction simultaneously with or after coating of the high-refractive-index composition.

The binder in the thus-cured film is, for example, in a state where the binder incorporates an anionic group of the dispersing agent as a result of crosslinking or polymerization reaction of the dispersing agent and the curable polyfunctional monomer or oligomer, which is a precursor of the binder. Furthermore, the anionic group of the binder in the cured film has a function of keeping the dispersion state of the high-refractive-index fine particles. The crosslinked or polymerized structure provides the binder with an ability to form a film, enabling improvement in physical strength, resistance to chemicals, and weatherabilty of the cured film containing the high-refractive-index fine particles.

{Thermoplastic Resin (A-1)}

The thermoplastic resins in (1) above are not particularly limited and may be appropriately selected depending on the intended purpose. Examples thereof include polystyrene resins, polyester resins, cellulose, polyether resins, vinyl chloride resins, vinyl acetate resins, vinyl chloride-vinyl acetate copolymers, polyacryl resins, polymethacryl resins, polyolefin resins, urethane resin, silicone resins and imide resins.

{Combinations of Reactive Curable Resins and Curing Agents (A-2)}

As the reactive curable resins in (2) above, thermosetting resins and/or ionizing radiation-curable resins are preferably used.

The thermosetting resins are not particularly limited and may be appropriately selected depending on the intended purpose. Examples thereof include phenol resins, urea resins, diallylphthalate resins, melamine resins, guanamine resins, unsaturated polyester resins, polyurethane resins, epoxy resins, aminoalkyd resins, melamine-urea co-condensated resins, silicon resins and polysiloxane resins.

The ionizing radiation-curable resins are not particularly limited and may be appropriately selected depending on the intended purpose. Examples thereof include resins containing as a functional group a radical polymerizable unsaturated group (e.g., a (meth)acryloyloxy group, a vinyloxy group, a styryl group and a vinyl group) and/or a cationic polymerizable group (e.g., an epoxy group, a thioepoxy group, a vinyloxy group and an oxetanyl group). Examples of such resins include relatively low-molecular-weight polyester resins, polyether resins, (meth)acryl resins, epoxy resins, urethane resins, alkyd resins, spiroacetal resins, polybutadiene resins and polythiolpolyene resins.

If necessary, the following conventionally known compounds are added to these reactive curable resins in use: curing agents such as crosslinking agents (e.g., epoxy compounds, polyisocyanate compounds, polyol compounds, polyamine compounds and melamine compounds) and polymerization initiators (e.g., UV photoinitiators such as azobis compounds, orgnaic peroxy compounds, organic halogen compounds, onium compounds and ketone compounds); and polymerization accelerating agents (e.g., organic metal compounds, acid compounds and basic compounds). Specifically, compounds described in Shinzo Yamashita, Tosuke Kaneko, "Handbook of Crosslinking Agent" (published by TAISEISHA, LTD. in 1981) are exemplified {Combinations of Binder Precursors and Polymerization Initiators (A-3)}

Next will be described a method for forming a cured binder by using the combinations in (3) above to allow the curable compound to perform crosslinking or polymerization reaction through application of light. This method is a preferred method for forming a cured binder.

A functional group of the photocurable polyfunctional monomer or oligomer which is the binder precursor may be any of a radical polymerizable functional group and a cationic polymerizable functional group.

Examples of the radical polymerizable functional group include ethylenically unsaturated groups such as a (meth)acryloyloxy group, a vinyloxy group, a styryl group and an allyl group. Among them, preferred is a (meth)acryloyloxy group. Particularly preferred is a polyfunctional monomer containing two or more radical polymerizable groups in the molecule thereof.

The radical polymerizable functional monomer is preferably selected from compounds having at least two ethylenically unsaturated bonds at the end thereof. Among them, particularly preferred are compounds having two to six ethylenically unsaturated bonds at the end thereof. Such compounds are widely known in the field of polymer materials, and usable compounds are not limited thereto. These can have a chemical form such as a monomer, a prepolymer (i.e., a dimer, a trimer and an oligomer), a mixture thereof or a copolymer thereof.

Examples of the radical polymerizable monomer include unsaturated carboxylic acids (e.g., acrylic acid, methacrylic acid, itaconic acid, crotonic acid, isocrotonic acid and maleic acid), esters thereof and amides thereof. Among them, particularly preferred are esters formed between unsaturated carboxylic acids and aliphatic polyhydric alcohol compounds, and amides formed between unsaturated carboxylic acids and aliphatic polyvalent amine compounds.

In addition, suitably used are addition reaction products formed between unsaturated carboxylic acid esters and amides having a nucleophilic substituent (e.g., a hydroxyl group, an amino group or a mercapto group) and monofunctional or polyfunctional isocyanates or epoxys; and dehydration reaction products formed between unsaturated carboxylic acid esters and amides having a nucleophilic substituent (e.g., a hydroxyl group, an amino group or a mercapto group) and polyfunctional carboxylic acids. Furthermore, suitably used are reaction products formed between (i) unsaturated carboxylic acid esters or amides having an electrophilic substituent (e.g., an isocyanate group or an epoxy group) and (ii) monofunctional or polyfunctional alcohols, amines or thiols. Moreover, usable are compounds that are the same as the above-listed compounds except that the unsaturated carboxylic acids are changed to, for example, unsaturated phosphonic acids or styrene.

Examples of the aliphatic polyhydric alcohol compounds include alkanediols, alkanetriols, cyclohexanediols, cyclohexanetriols, inositol, cyclohexanedimethanol, pentaerythritol, sorbitol, dipentaerythritol, tripentaerythritol, glycerin and diglycerin. Examples of polymerizable ester compounds (monoesters or polyesters) formed between these aliphatic polyhydric alcohol compounds and unsaturated carboxylic acids include compounds described in paragraphs [0026] and [0027] of JP-A No. 2001-139663.

Other polymerizable esters suitably used are, for example, vinyl methacrylate, allyl methacrylate, ally acrylate, aliphatic alcohol esters described in, for example, Japanese Patent Application Publication (JP-B) Nos. 46-27926 and 51-47334 and JP-A No. 57-196231, compounds having an aromatic skeleton described in, for example, JP-A No. 02-226149, and compounds having an amino group described in JP-A No. 01-165613.

Furthermore, examples of polymerizable amides formed between aliphatic polyvalent amine compounds and unsaturated carboxylic acids include methylenebis(meth)acrylamide, 1,6-hexamethylenebis(meth)acrylamide, diethylenetriaminetris(meth)acrylamide, xylylenebis(meth)acrylamide, and compounds having a cyclohexylene structure described in JP-B No. 54-21726.

Moreover, the following compounds may be used: vinylurethane compounds having two or more polymerizable vinyl groups in one molecule thereof (described in, for example, JP-B No. 48-41708), urethane acrylates (described in, for example, JP-B No. 02-16765), urethane compounds having an ethylene oxide skeleton (described in, for example, JP-B No. 62-39418), polyester acrylates (described in, for example, JP-B No. 52-30490), and photocurable monomers and oligomers described in Journal of the Adhesion Society of Japan, Vol. 20, No. 7, pp. 300 to 308 (1984). Two or more kinds of these radical polymerizable polyfunctional monomers may be used in combination.

Next, description will be given to a compound containing a cationic polymerizable group usable for forming the polymer of the fine particle layer (hereinafter this compound may be referred to as "cationic polymerizable compound" or "cationic polymerizable organic compound").

The cationic polymerizable compound may be any compound which causes polymerization reaction and/or cross-linking reaction when irradiated with active energy rays in the presence of a cationic polymerization initiator sensitive to active energy rays. Typical examples thereof include epoxy compounds, cyclic thioether compounds, cyclic ether compounds, spiroorthoester compounds, vinyl hydrocarbon compounds and vinyl ether compounds. These cationic polymerizable organic compounds may be used alone or in combination.

The number of cationic polymerizable groups in one molecule of the cationic polymerizable group-containing compound is preferably 2 to 10, more preferably 2 to 5. The average molecular weight of the cationic polymerizable group-containing compound is preferably 3,000 or lower, more preferably 200 to 2,000, further preferably 400 to 1,500. When the average molecular weight thereof is higher than the above lower limit, such cationic polymerizable group-containing compounds do not cause any inconveniences such as problematic evaporation in the course of the formation of a coating film. When the average molecular weight thereof is lower than the above upper limit, such cationic polymerizable group-containing compounds do not cause any problems such as deteriorated compatibility with the high-refractive-index composition.

Examples of the epoxy compounds include aliphatic epoxy compounds and aromatic epoxy compounds.

Examples of the aliphatic epoxy compounds include: polyglycidyl ethers of aliphatic polyhydric alcohols or alkylene oxide adducts thereof; polyglycidyl esters of aliphatic long-chain polybasic acids; and homopolymers of glycidyl acrylate or glycidyl methacrylate and copolymers of glycidyl acrylate and glycidyl methacrylate. Besides the epoxy compounds, further examples include: monoglycidyl ethers of aliphatic higher alcohols; monoglycidyl esters of higher fatty acids; epoxidized soybean oil; butyl epoxystearate; octyl epoxystearate; epoxidized linseed oil; and epoxidized polybutadiene. Examples of alicyclic epoxy compounds include cyclohexene oxide- or cyclopentene oxide-containing compounds which are obtained by epoxidizing, with an appropriate oxidizing agent such as hydrogen peroxide or a peracid, polyglycidyl esters of polyhydric alcohols containing at least one alicyclic ring or compounds containing an unsaturated alicyclic ring (e.g., cyclohexene, cyclopentene, dicyclooctene or tricyclodecene).

Examples of the aromatic epoxy compounds include monohydric or polyhydric phenols having at least one aromatic nucleus; and monoglycidyl ethers or polyglycidyl ethers of alkylene oxide adducts of the monohydric or polyhydric phenols having at least one aromatic nucleus. Specific examples of these epoxy compounds include: compounds described in paragraphs [0084] to [0086] of JP-A No. 11-242101; and compounds described in paragraphs [0044] to [0046] of JP-A No. 10-158385.

Among these epoxy compounds, considering quick drying property, aromatic epoxides and alicyclic epoxides are preferred, with alicyclic epoxides being more preferred. The epoxy compounds may be used alone, or two or more kinds of the epoxy compounds may be appropriately combined together in use.

Examples of the cyclic thioether compounds include compounds which are the same as the above-listed epoxy compounds except that the epoxy ring is changed to a thioepoxy ring.

Examples of oxetanyl group-containing compounds as cyclic ethers include compounds described in paragraphs [0024] and [0025] of JP-A No. 2000-239309. These compounds are preferably used in combination with epoxy-group containing compounds.

Examples of the spiroorthoester compounds include compounds described in JP-A No. 2000-506908.

Examples of the vinyl hydrocarbon compounds include styrene compounds, vinyl group-substituted alicyclic hydrocarbon compounds (e.g., vinyl cyclohexane and vinyl bicycloheptene), the compounds listed above as the radical polymerizable monomer, propenyl compounds {described in, for example, "J. Polymer Science: Part A: Polymer Chemistry," Vol. 32, p. 2895 (1994)}, alcoxy allene compounds {described in, for example, "J. Polymer Science: Part A: Polymer Chemistry," Vol. 33, p. 2493 (1995)}, vinyl compounds {for example, "J. Polymer Science: Part A: Polymer Chemistry," Vol. 34, p. 1015 (1996) and JP-A No. 2002-29162} and isopropenyl compounds {described in, for example, "J. Polymer Science: Part A: Polymer Chemistry," Vol. 34, p. 2051 (1996)}. These may be used alone, or two or more kinds of them may be appropriately combined together in use.

The polyfunctional compound used is preferably a compound containing, in the molecule thereof, at least one selected from the above radical polymerizable groups and cationic polymerizable groups. Examples thereof include: compounds described in paragraphs [0031] to [0052] of JP-A No. 08-277320; and compounds described in paragraph [0015] of JP-A No. 2000-191737. However, compounds used in the present invention are not limited thereto.

The mass ratio of the radical polymerizable compound and the cationic polymerizable compound contained is preferably 90:10 to 20:80, more preferably 80:20 to 30:70, as the radical polymerizable compound:the cationic polymerizable compound.

Next will be described in detail the polymerization initiator used in combination with the binder precursor in the combinations in (3) above.

Examples of the polymerization initiator include thermal polymerization initiators and photopolymerization initiators.

The polymerization initiator is preferably a compound that generates radicals or acids through application of light and/or heat. The maximum absorption wavelength of the photopolymerization initiator is preferably 400 nm or lower. Since it has an absorption wavelength in the ultraviolet region, the photopolymerization initiator can be handled under white light. Alternatively, a compound having the maximum absorption wavelength in the near infrared region can be used.

The above radical-generating compound refers to a compound that generates radicals through application of light and/or heat, to thereby initiate and accelerate polymerization of a compound having a polymerizable unsaturated group. As this compound, a known polymerization initiator or a compound having a bond of low bond-dissociation energy may be appropriately selected for use. The radical-generating compounds may be used alone or in combination.

Examples of the radical-generating compound include: thermal radical polymerization initiators such as organic peroxide compounds and azo polymerization initiators; and photoradical polymerization initiators such as organic peroxide compounds (described in, for example, JP-A No. 2001-139663), amine compounds (described in, for example, JP-B No. 44-20189), metallocene compounds (described in, for example, JP-A Nos. 05-83588 and 01-304453), hexaarylbiimidazole compounds (described in, for example, U.S. Pat. No. 3,479,185), disulfone compounds (described in, for example, JP-A No. 05-239015 and 61-166544), organic halogenated compounds, carbonyl compounds and organic boric-acid compounds.

Examples of the organic halogenated compounds include compounds described in, for example, "Bull. Chem. Soc Japan," Vol. 42, p. 2924 (1969) written by Wakabayashi et al., U.S. Pat. No. 3,905,815, JP-A No. 05-27830, and M. P. Hutt, "J. Heterocyclic Chemistry," Vol. 1 (No. 3), (1970). In particular, examples thereof include oxazole compounds having a trihalomethyl group as a substituent and s-triazine compounds. More suitable examples thereof include s-triazine derivatives where at least one mono-, di- or trihalogen-substituted methyl group is bonded to an s-triazine ring.

Examples of the carbonyl compounds include: compounds described in "Latest UV Curing Technology" pp. 60 to 62 [published by TECHNICAL INFORMATION INSTITUTE CO., LTD., 1991], paragraphs [0015] and [0016] of JP-A No. 08-134404, and paragraphs [0029] to [0031] of JP-A No. 11-217518. Specific examples thereof include acetophenone compounds, hydroxyacetophenone compounds, benzophenone compounds, thioxane compounds, benzoin compounds (e.g., benzoin ethyl ether and benzoin isobutyl ether), benzoic acid ester derivatives (e.g., ethyl p-dimethylaminobenzoate and ethyl p-diethylaminobenzoate), benzyl dimethyl ketal and acyl phosphine oxide.

Examples of the organic boric-acid compounds include: organic boric-acid compounds described in, for example, Japanese Patent (JP-B) No. 2764769, JP-A No. 2002-116539, and Kunz, Martin, "Rad. Tech'98. Proceeding Apr. 19 to 22, 1998, Chicago." Specifically, compounds described in paragraphs [0022] to [0027] of JP-A No. 2002-116539 are exemplified. Further examples of the organic boric-acid compounds include: organic boron-transition metal coordination complexes described in, for example, JP-A Nos. 06-348011, 07-128785, 07-140589, 07-306527 and 07-292014.

Only one kind of these radical-generating compounds may be added, or two or more kinds thereof may be used in combination.

The amount of the radical-generating compound added is preferably 0.1% by mass to 30% by mass, more preferably 0.5% by mass to 25% by mass, further preferably 1% by mass to 20% by mass, relative to the total amount of the radical polymerizable monomer. When the amount thereof falls within the above range, the high-refractive-index composition is free of problems about stability over time and is highly polymerizable.

Next, a photoacid generator usable as the photopolymerization initiator will be described in detail.

Examples of the photoacid generator include known compounds such as photoinitiators for photocationic polymerization, photodecoloring agents for dyes, photodiscoloring agents, and known photoacid generators used in, for example, microresist; and mixtures thereof. Further examples of the photoacid generator include organic halogenated compounds, disulfone compounds and onium compounds, with organic halogenated compounds and disulfone compounds being particularly preferred. Specific examples of the organic halogenated compounds and disulfone compounds are similar to the compounds described as the radical-generating compounds.

Examples of the onium compounds include diazonium salts, ammonium salts, iminium salts, phosphonium salts, iodonium salts, sulfonium salts, arsonium salts and selenonium salts. Specific examples thereof include compounds described in, for example, paragraphs [0058] and [0059] of JP-A No. 2002-29162.

Onium salts are particularly suitably used as the acid generator. Among them, diazonium salts, iodonium salts, sulfonium salts and iminium salts are particularly preferred from the viewpoints of, for example, photosensitivity for photopolymerization initiation and material stability of compounds.

Examples of the onium salts include: amyl sulfonium salts described in paragraph [0035] of JP-A No. 09-268205; diaryliodonium salts and triarylsulfonium salts described in paragraphs [0010] and [0011] of JP-A No. 2000-71366; sulfonium salts of thiobenzoic acid S-phenyl esters described in paragraph [0017] of JP-A No. 2001-288205; and onium salts described in paragraphs [0030] to [0033] of JP-A No. 2001-133696.

Further examples of the photoacid generator include: organic metal/organic halogenated compounds described in paragraphs [0059] to [0062] of JP-A No. 2002-29162; photoacid generators having an o-nitrobenzyl-type protective group; and compounds that decompose by light to generate sulfonic acid (e.g., imino sulfonate).

Only one kind of these acid generators may be used, or two or more kinds thereof may be used in combination. The amount of the acid generator added is preferably 0.1% by mass to 20% by mass, more preferably 0.5% by mass to 15% by mass, further preferably 1% by mass to 10% by mass, relative to the total mass of all the cationic polymerizable monomers. The amount of the acid generator falling within the above range is preferred from the viewpoints of stability and polymerization reactivity of the high-refractive-index composition.

The high-refractive-index composition preferably contains the radical polymerization initiator in an amount of 0.5% by mass to 10% by mass or the cationic polymerization initiator in an amount of 1% by mass to 10% by mass relative to the total mass of the radical polymerizable compound or the cationic polymerizable compound. More preferably, the high-refractive-index composition contains the radical polymerization initiator in an amount of 1% by mass to 5% by mass or the cationic polymerization initiator in an amount of 2% by mass to 6% by mass relative to the total mass of the radical polymerizable compound or the cationic polymerizable compound When the polymerization reaction is performed through application of ultraviolet rays, a conventionally known ultraviolet ray spectral sensitizer or a chemical sensitizer may further be added to the high-refractive-index composition. Examples of these sensitizers include Michler's ketone, amino acids (e.g., glycine) and organic amines (e.g., butyl amine and dibutyl amine).

When the polymerization reaction is performed through application of near infrared rays, a near infrared spectral sensitizer is preferably used in combination. The near infrared spectral sensitizer used in combination may be a light-absorbing compound having an absorption band in at least a part of the wavelength region of 700 nm or higher, and is preferably a compound having a molecular extinction coefficient of 10,000 or greater. Furthermore, the near infrared spectral sensitizer is preferably a compound exhibiting absorption in the wavelength region of 750 nm to 1,400 nm and having a molecular extinction coefficient of 20,000 or greater. More preferably, the near infrared spectral sensitizer is a compound having a non-absorbing region in the visible light wavelength region of 420 nm to 700 nm and being optically transparent.

The near infrared spectral sensitizer may be various pigments and dyes known as a near infrared absorption pigment and a near infrared absorption dye. Among them, conventionally known near infrared ray absorbers are preferably used. Examples thereof include: commercially available dyes; and known dyes described in literature {e.g., "Near Infrared Absorption Pigment" on pp. 45 to 51, May issue 1986 of "Chemical Industry", 2.3 in Chapter 2 of "Development and Market Trend of Functional Colorant in the 90's" (1990) published by CMC Publishing Co., Ltd., "Special Functional Colorant" [edited by Ikemori and Hashiratani, 1986, published by CMC Publishing Co., Ltd.], J. FABIAN, "Chem. Rev.," Vo. 92, pp. 1197 to 1226 (1992)}, catalog published in 1995 by Nippon Photosensitive Colorant Research Institute, and patent literature and laser colorant catalog and published in 1989 by Exciton Inc.
—(B) Organic Metal Compound Containing a Hydrolyzable Functional Group and a Partially Condensed Product of the Organic Metal Compound—

It is preferably to form as the matrix a cured film from a coating film obtained through sol-gel reaction using the organic metal compound containing a hydrolyzable functional group.

Examples of the organic metal compound include compounds containing metals such as Si, Ti, Zr and Al.

Examples of the hydrolyzable functional group include alkoxy groups, alkoxycarbonyl groups, halogen atoms and a hydroxyl group. Among them, particularly preferred are alkoxy groups such as a methoxy group, an ethoxy group, a propoxy group and a butoxy group. Preferred organic metal compounds are organic silicon compounds represented by the following General Formula (2) and partially condensated products thereof (partial condensates). Note that, the fact that the organic silicon compounds represented by General Formula (2) are easily hydrolyzed and then cause dehydration condensation reaction is a well-known fact.

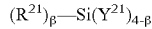   General Formula (2)

In General Formula (2), $R^{21}$ represents a substituted or unsubstituted C1-C30 aliphatic group or C6-C14 aryl group. $Y^{21}$ represents a halogen atom (e.g., a chlorine atom or a bromine atom), a OH group, a $OR^{22}$ group or a $OCOR^{22}$ group, where $R^{22}$ represents a substituted or unsubstituted alkyl group. $\beta$ is an integer of 0 to 3, preferably 0, 1 or 2, particularly preferably 1. When $\beta$ is 0, $Y^{21}$ represents a $OR^{22}$ group or a $OCOR^{22}$ group.

In General Formula (2), the aliphatic group represented by $R^{21}$ is preferably a C1-C18 aliphatic group (e.g., methyl, ethyl, propyl, butyl, pentyl, hexyl, octyl, decyl, dodecyl, hexadecyl, octadecyl, benzyl, phenetyl, cyclohexyl, cyclohexylmethyl, hexenyl, decenyl or dodecenyl). It is more preferably a C1-C12 aliphatic group, particularly preferably a C1-C8 aliphatic group. The aryl group represented by $R^{21}$ is, for example, phenyl, naphthyl or anthranil, and is preferably phenyl.

The substituent which they may have is not particularly limited and may be appropriately selected depending on the intended purpose. Preferred examples thereof include halogens (e.g., fluorine, chlorine and bromine), a hydroxyl group, a mercapto group, a carboxyl group, an epoxy group, alkyl groups (e.g., methyl, ethyl, i-propyl, propyl and t-butyl), aryl groups (e.g., phenyl and naphthyl), aromatic heterocyclic groups (e.g., furyl, pyrazoly and pyridyl), alkoxy groups (e.g., methoxy, ethoxy, i-propoxy and hexyloxy), aryloxy groups (e.g., phenoxy), alkylthio groups (e.g., methylthio and ethylthio), arylthio groups (e.g., phenylthio), alkenyl groups (e.g., vinyl and 1-propenyl), alkoxysilyl groups (e.g., trimethoxysilyl and triethoxysilyl), acyloxy groups {e.g., acetoxy and (meth)acryloyl}, alkoxycarbonyl groups (e.g., methoxycarbonyl and ethoxycarbonyl), aryloxylcarbonyl groups (e.g., phenoxycarbonyl), carbamoyl groups (e.g., carbamoyl, N-methylcarbamoyl, N,N-dimethylcarbamoyl and N-methyl-N-octylcarbamoyl) and acylamino groups (e.g., acetylamino, benzoylamino, acrylamino and methacrylamino).

Among these substituents, further preferred are a hydroxyl group, a mercapto group, a carboxyl group, an epoxy group, alkyl groups, alkoxysilyl groups, aryloxy groups and acylamino groups, and particularly preferred are an epoxy group, polymerizable acyloxy groups {(meth) acryloyl} and polymerizable acylamino groups (acrylamino and methacrylamino). These substituents may further have substituents.

As described above, $R^{22}$ represents a substituted or unsubstituted alkyl group, and the alkyl group is not particularly limited and is, for example, the same aliphatic group as in $R^{21}$. The substituent which the alkyl group $R^{22}$ may have is the same as in $R^{21}$.

The amount of the compound represented by General Formula (2) is preferably 10% by mass to 80% by mass, more preferably 20% by mass to 70% by mass, further preferably 30% by mass to 50% by mass, relative to the total solid content of the high-refractive-index composition.

Examples of the compound represented by General Formula (2) include compounds described in paragraphs [0054] to [0056] of JP-A No. 2001-166104.

The organic binder in the high-refractive-index composition preferably has a silanol group. When the binder has a silanol group, the fine particle layer is further improved in mechanical strength, resistance to chemicals, and weatherabilty, which is preferred. The silanol group can be introduced into the binder in the following manner, for example. Specifically, an organic silicon compound represented by General Formula (2) having a crosslinkable or polymerizable functional group is incorporated into the high-refractive-index composition together with: a binder precursor (e.g., a curable polyfunctional monomer or oligomer), which is a binder-forming ingredient in the high-refractive-index composition; a polymerization initiator; and a dispersing agent contained in a dispersion liquid of the high-refractive-index fine particles. The resultant high-refractive-index composition is coated on a transparent support, and the dispersing agent, the polyfunctional monomer or oligomer, and the organic silicon compound represented by General Formula (2) are allowed to perform crosslinking or polymerization reaction.

Hydrolysis reaction/condensation reaction for curing the organic metal compound is preferably performed in the presence of a catalyst. Examples of the catalyst include inorganic acids such as hydrochloric acid, sulfuric acid and nitric acid; organic acids such as oxalic acid, acetic acid, formic acid, trifluoroacetic acid, methanesulfonic acid and toluenesulfonic acid; inorganic bases such as sodium hydroxide, potassium hydroxide and ammonia; organic bases such as triethylamine and pyridine; metal alkoxides such as triisopropoxy aluminum, tetrabutoxy zirconium and tetrabutoxy titanate; and metal chelate compounds such as β-diketones and β-ketoesters. Specific examples thereof include compounds described in paragraphs [0071] to [0083] of JP-A No. 2000-275403.

The amount of the catalyst in the composition is preferably 0.01% by mass to 50% by mass, more preferably 0.1% by mass to 50% by mass, further preferably 0.5% by mass to 10% by mass, relative to the amount of the organic metal compound. Note that, it is preferable to appropriately adjust reaction conditions depending on the reactivity of the organic metal compound.

The matrix in the high-refractive-index composition preferably has a specific polar group. Examples of the specific polar group include anionic groups, an amino group and quaternary ammonium groups. Specific examples of the anionic groups, amino group and quaternary ammonium groups are similar to the groups described regarding the dispersing agent.

—Solvent—

The above solvent is not particularly limited and may be appropriately selected depending on the intended purpose. Examples thereof include alcohols, ketones, esters, amides, ethers, ether esters, hydrocarbons and halogenated hydrocarbons. Specific examples include alcohols such as methanol, ethanol, propanol, butanol, benzyl alcohol, ethylene glycol, propylene glycol and ethylene glycol monoacetate; ketones such as methyl ethyl ketone, methyl isobutyl ketone, cyclohexanone and methylcyclohexanone; esters such as methyl acetate, ethyl acetate, propyl acetate, butyl acetate, ethyl formate, propyl formate, butyl formate and ethyl lactate; aliphatic hydrocarbons such as hexane and cyclohexane; halogenated hydrocarbons such as methylchloroform; aromatic hydrocarbons such as benzene, toluene and xylene; amides such as dimethyl formamide, dimethyl acetamide and n-methylpyrrolidone; ethers such as dioxane, tetrahydrofuran, ethylene glycol dimethyl ether and propylene glycol dimethyl ether; and ether alcohols such as 1-methoxy-2-propanol, ethyl cellosolve and methyl carbinol. These may be used alone or in combination. Among them, toluene, xylene, methyl ethyl ketone, methyl isobutyl ketone, cyclohexanone and butanol are particularly preferred. Besides, preferably used is a coating solvent mainly containing a ketone solvent such as methyl ethyl ketone, methyl isobutyl ketone or cyclohexanone.

The amount of the ketone solvent is preferably 10% by mass or more, more preferably 30% by mass or more, further preferably 60% by mass or more, relative to all the solvents contained in the high-refractive-index composition.

The matrix having a specific polar group can be obtained in the following manner, for example. Specifically, the following ingredients are incorporated into the high-refractive-index composition: a dispersion liquid containing high-refractive-index fine particles and a dispersing agent; a film-forming ingredient which is a combination of a binder precursor having a specific polar group (e.g., a curable polyfunctional monomer or oligomer having a specific polar group) and a polymerization initiator, or the organic silicon compound represented by General Formula (2) having a specific polar group and a crosslinkable or polymerizable functional group, or both of the combination and the organic silicon compound; and an optional monofunctional monomer having a specific polar group and a crosslinkable or polymerizable functional group. The resultant coating composition is coated on a transparent support, and the dispersing agent, the monofunctional monomer, the polyfunctional monomer or oligomer and/or the organic silicon compound represented by General Formula (2) are allowed to perform crosslinking or polymerization reaction.

The monofunctional monomer having a specific polar group can serve as a dispersion aid for the high-refractive-index fine particles in the high-refractive-index composition, which is preferred. Furthermore, when the monofunctional monomer is allowed after coating to perform crosslinking or polymerization reaction with the dispersing agent and the polyfunctional monomer or oligomer to form a binder, it is possible to form a fine particle layer excellent in mechanical strength, resistance to chemicals, and weatherability since the high-refractive-index fine particles are kept dispersed in the fine particle layer favorably uniformly.

A coating liquid containing the high-refractive-index composition and the fine particles added therein is coated on the transparent substrate using a conventionally known thin-film forming method such as a dip coat method, an air knife coat method, a curtain coat method, a roller coat method, a wire bar coat method, a gravure coat method, a microgravure coat method or an extrusion coat method, followed by drying and applying light and/or heat, so that the fine particle layer can be formed. Curing through application of light is preferred since the coating liquid can be cured advantageously rapidly. Furthermore, it is also preferable to apply heat in the latter half of the curing treatment by light.

A light source for the light application may be any light so long as it is in the ultraviolet region or the near infrared region. As for the light source for ultraviolet light, examples thereof include ultra-high pressure mercury lamps, high pressure mercury lamps, medium pressure mercury lamps and low pressure mercury lamps; chemical lamps; carbon arch lamps; metal halide lamps; xenon lamps; and solar light. A variety of available laser light sources of 350 nm to 420 nm in wavelength may be allowed to form multibeams for application. As for the light source for near infrared light, examples thereof include halogen lamps, xenon lamps and high-pressure sodium lamps. A variety of available laser light sources of 750 nm to 1,400 nm in wavelength may be allowed to form multibeams for application.

The photoradical polymerization through application of light can be performed in air or inert gas. However, it is preferable to make the oxygen concentration of an atmosphere for the photoradical polymerization the lowest possible for the purposes of, for example, shortening the time required for initiation of polymerization of the radical polymerizable monomer and sufficiently increasing a degree of polymerization. The irradiation dose of ultraviolet rays applied is preferably $0.1$ $mW/cm^2$ to $100$ $mW/cm^2$, and the light irradiation dose on the surface of a coating film is preferably $100$ $mJ/cm^2$ to $1,000$ $mJ/cm^2$. Also, the distribution in temperature of a coating film in a light application step is preferably narrower. It is preferably controlled within $\pm 3°$ C., more preferably within $\pm 1.5°$ C. When the distribution in temperature falls within this range, polymerization reaction proceeds uniformly in both an in-plane direction and a depth direction of a coating film, which is preferred.

The average thickness of the fine particle layer is preferably 5 μm to 200 μm, more preferably 5 μm to 50 μm. When the average thickness thereof is less than 5 μm, the fine particle layer cannot exhibit a sufficient effect of changing the angle of light, so that the maximum light extraction efficiency cannot be obtained in some cases. When it is more than 200 μm, light is excessively scattered and back-scattered light increases to increase light returned to the interior of an organic electroluminescent element, leading to a drop in light extraction efficiency. In addition, such a thick fine particle layer may lead to cost elevation.

The above average thickness can be determined from the thicknesses of the fine particle layer measured in the following manner, for example. Specifically, a part of the fine particle layer is cut out and the resultant cut section is observed under a scanning electron microscope (S-3400N, product of Hitachi High-Technologies Corporation) to thereby measure the thicknesses of the fine particle layer, from which the average thickness is determined.

<<Light-Extracting Member>>

The light-extracting member is not particularly limited and may be appropriately selected depending on the intended purpose so long as it has a function of extracting light. For example, the light-extracting member is preferably a prism, a prism array, a lens, a lens array, a fine concavo-convex structure or a fine particle layer. As described above, a prism having an optimized structure can convey light entering the prism within a certain range of angle to air regardless of the relative position between the light-emitted point and the center of the prism in surface light emission. Thus, a prism and a prism array are particularly preferred since they have a higher effect of improving light extraction efficiency in an organic electroluminescent device.

The prism, prism array, lens, lens array, fine concavo-convex structure and fine particle layer for the light-extracting member are similar to the prism, prism array, lens, lens array, fine concavo-convex structure and fine particle layer for the light distribution-converting member, and thus their explanation is omitted.

The light-extracting unit has: embodiment (1) where the light distribution-converting member and the light-extracting member are separated; and embodiment (2) where the light-extracting member and the light distribution-converting member are united.

Examples of the embodiment (1), where the light distribution-converting member and the light-extracting member are separated, include: an embodiment where the prism layer and the fine particle layer are laminated on top of each other; an embodiment where the lens layer and the fine particle layer are laminated on top of each other, and an embodiment where the fine concavo-convex structure and the fine particle layer are laminated on top of each other.

Among them, in an embodiment where the light-extracting member is a prism layer made of a prism or of a prism array, the light distribution-converting member is a fine particle layer containing fine particles and a polymer, and the fine particle layer and the prism layer are provided on a transparent substrate in this order, light emitted from an organic electroluminescent layer is first converted to have an optimum light distribution with respect to the light-extracting member by the light distribution-converting member, and then enters the light-extracting member to attain high light extraction efficiency. Also, it is particularly preferred to dispose the organic electroluminescent device and the light-extracting unit so as to sandwich the transparent substrate, since the light-extracting unit does not adversely affect characteristics of the organic electroluminescent device.

Examples of the embodiment (2), where the light-extracting member and the light distribution-converting member are united (i.e., a united structure of the light-extracting member and the light distribution-converting member), include: an embodiment where the prism layer and the fine particle layer are united; an embodiment where the lens layer and the fine particle layer are united; and an embodiment where the fine concavo-convex structure and the fine particle layer are united.

Among them, in an embodiment where the prism layer and the fine particle layer are united; i.e., the prism layer contains fine particles and a polymer, the light distribution-converting portion is used as the light-incident side of the light-extracting portion, and it is not necessary to separately provide the prism and the fine particle layer in production, which does not require a step of attaching them to each other. As a result, since the production process can be simplified and the production cost can be reduced, this embodiment is particularly preferred.

The method for uniting the light-extracting member and the light distribution-converting member is not particularly limited and may be appropriately selected depending on the intended purpose. In one employable method for uniting the prism layer and the fine particle layer, a polymer having a refractive index equal to or higher than those of the fine particles and the organic electroluminescent layer is used as a material of the prism and formed into a prism by a method such as imprinting.

Here, specific embodiments of the light-extracting unit will be described with reference to the drawings.

FIGS. 11A to 11D are each a schematic view of an organic electroluminescent device where the light-extracting member is a prism 101, a lens 102, a fine concavo-convex structure 103 or a fine particle layer 104, and the light distribution-converting member is a lens 102. The refractive index of the organic electroluminescent layer 2 is n.

The refractive index n1 of the lens 102 serving as the light distribution-converting member satisfies the following relationships: n1≥n where n is the refractive index of the organic electroluminescent layer; and n2>n1 where n2 is the refractive index of media at the light-emitted side of the light distribution-converting member. If necessary, the lens height T and the lens diameter 2R are optimized with respect to the distribution of light emitted from the organic electroluminescent layer. Specifically, it is preferred that the lens height T is 0.05 mm to 1 mm and the lens diameter 2R is 0.1 mm to 2 mm.

In order for the lens serving as the light distribution-converting member to pass through light emitted from an organic electroluminescent layer without totally reflecting the light due to the difference in refractive index, (1) the refractive index n1 of the material of the lens forming the light distribution-converting member is preferably equal to or higher than the refractive index n of the organic electroluminescent layer; i.e., the refractive index n1 of the lens≥the refractive index n of the organic electroluminescent layer, and (2) the refractive index n2 of media at the light-emitted side of the light distribution-converting member is preferably higher than the refractive index n1 of the material of the lens forming the light distribution-converting member; i.e., n2>n1.

Figure 11A:
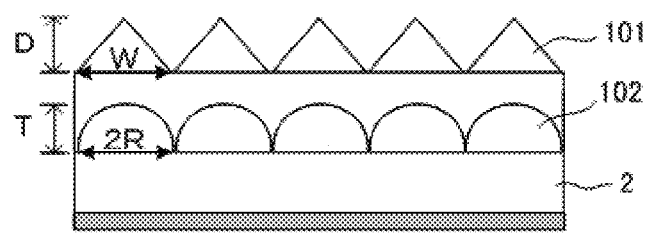
FIG. 11A is a schematic view of an organic electroluminescent device containing a combination of a prism layer (prism array) serving as a light-extracting member and a lens layer (lens array) serving as a light distribution-converting member.

Considering the production process and cost, the refractive index n3 of the light-extracting member satisfies n3≤n2 or may satisfy n3=n2.

Where the light-extracting member is prism 101 as illustrated in FIG. 11A, if necessary, the prism height D and the prism width W are optimized with respect to the distribution of light emitted from the organic electroluminescent layer 2.

Figure 11B:
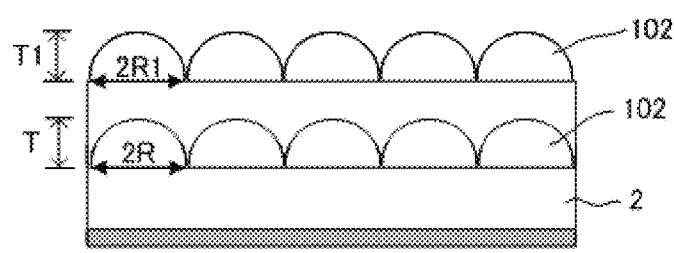
FIG. 11B is a schematic view of an organic electroluminescent device containing a combination of a lens layer (lens array) serving as a light-extracting member and a lens layer (lens array) serving as a light distribution-converting member.

Specifically, it is preferred that the prism height D is 0.05 mm to 1 mm and the prism width W is 0.05 mm to 2 mm. The refractive index of media at the light-incident side is n2 and the refractive index of the material forming the prism 101 is n3.

Where the light-extracting member is lens 102 as illustrated in FIG. 11B, if necessary, the lens height T1 and the lens diameter 2R are optimized with respect to the distribution of light emitted from the organic electroluminescent layer 2.

Figure 11C:
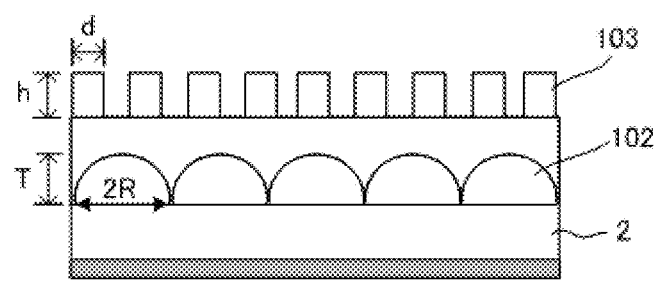
FIG. 11C is a schematic view of an organic electroluminescent device containing a combination of a fine concavo-convex structure serving as a light-extracting member and a lens layer (lens array) serving as a light distribution-converting member.
Figure 11D:
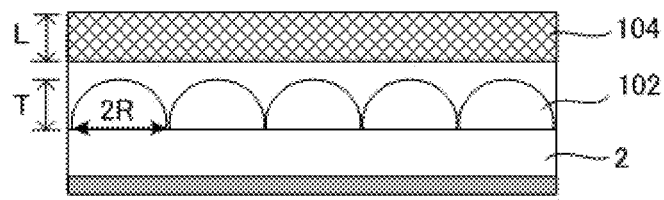
FIG. 11D is a schematic view of an organic electroluminescent device containing a combination of a fine particle layer serving as a light-extracting member and a lens layer (lens array) serving as a light distribution-converting member.

Specifically, it is preferred that the lens height T is 0.05 mm to 2 mm and the lens diameter 2R is 0.1 mm to 2 mm. The refractive index of media at the light-incident side is n2 and the refractive index of the material forming the lens 102 is n3.

Where the light-extracting member is fine concavo-convex structure 103 as illustrated in FIG. 11C, if necessary, the height h of the convex and concave portions and the width d of the convex and concave portions are optimized with respect to the distribution of light emitted from the organic electroluminescent layer 2. Specifically, it is preferred that the height h of the convex and concave portions is 0.3 µm to 3 µm and the width d of the convex and concave portions is 0.5 µm to 3 µm. The refractive index of media at the light-incident side is n2 and the refractive index of the material forming the fine concavo-convex structure 103 is n3.

Where the light-extracting member is fine particle layer 104 as illustrated in FIG. 11D, if necessary, the thickness L of the fine particle layer, the refractive index nb of a polymer of the fine particle layer, the average particle diameter φ of the fine particles, the refractive index np of the fine particles, np≠nb, and the filling rate by volume η of the fine particles are optimized with respect to the distribution of light emitted from the organic electroluminescent layer 2. Specifically, it is preferred that the thickness L of the fine particle layer is 1 µm to 50 µm, the refractive index nb of a polymer of the fine particle layer 104 is equal to or higher than the refractive index n of the organic electroluminescent layer, the average particle diameter φ of the fine particles is 0.5 µm to 10 µm, the refractive index np of the fine particles is 1.4 to 2.6, and the filling rate by volume η of the fine particles is 10% to 50%. The refractive index of media at the light-incident side is n2 and the refractive index nb of a polymer of the fine particle layer 104 (indicated with n3, here).

FIGS. 12A to 12D are each a schematic view of an organic electroluminescent device where the light-extracting member is a prism 101, a lens 102, a fine concavo-convex structure 103 or a fine particle layer 104, and the light distribution-converting member is a prism 101. Note that, the refractive index of the organic electroluminescent layer 2 is n.

The refractive index of the prism 101 serving as the light distribution-converting member satisfies n1≥n and n2>n1. If necessary, the prism height D and the prism width W are optimized with respect to the distribution of light emitted from the organic electroluminescent layer.

Specifically, it is preferred that the prism height D is 0.05 mm to 1 mm and the prism width W is 0.05 mm to 4 mm.

In order for the prism serving as the light distribution-converting member to pass through light emitted from an organic electroluminescent layer without totally reflecting the light due to the difference in refractive index, (1) the refractive index n1 of the material of the prism serving as the light distribution-converting member is preferably equal to or higher than the refractive index n of the organic electroluminescent layer; i.e., n1≥n, and (2) the refractive index n2 of media at the light-emitted side of the prism serving as the light distribution-converting member is preferably higher than the refractive index n1 of the material of the prism serving as the light distribution-converting member; i.e., n2>n1.

Figure 12A:
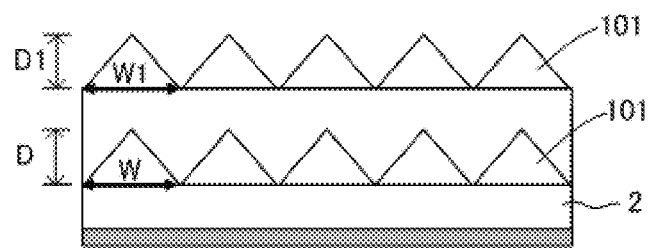
FIG. 12A is a schematic view of an organic electroluminescent device containing a combination of a prism layer (prism array) serving as a light-extracting member and a prism layer (prism array) serving as a light distribution-converting member.
Figure 12B:
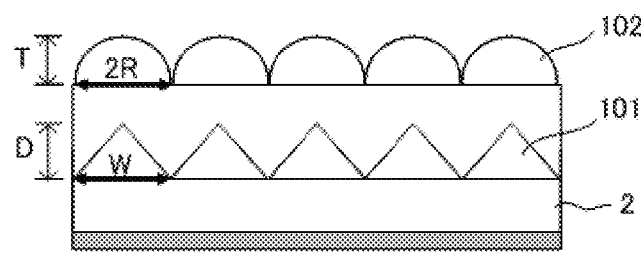
FIG. 12B is a schematic view of an organic electroluminescent device containing a combination of a lens layer (lens array) serving as a light-extracting member and a prism layer (prism array) serving as a light distribution-converting member.
Figure 12C:
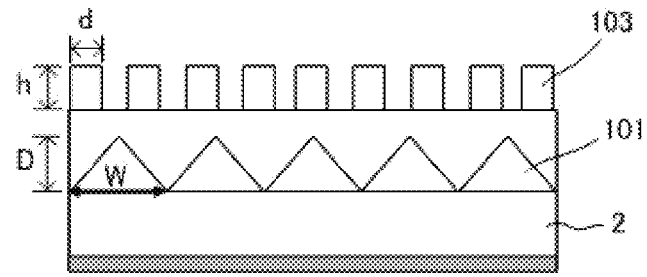
FIG. 12C is a schematic view of an organic electroluminescent device containing a combination of a fine concavo-convex structure serving as a light-extracting member and a prism layer (prism array) serving as a light distribution-converting member.
Figure 12D:
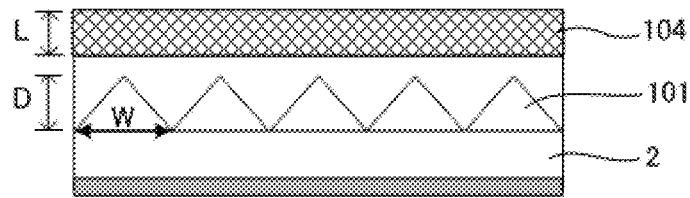
FIG. 12D is a schematic view of an organic electroluminescent device containing a combination of a fine particle layer serving as a light-extracting member and a prism layer (prism array) serving as a light distribution-converting member.

Considering the production process and cost, the refractive index n3 of the light-extracting member satisfies n3≥n2 or may satisfy n3=n2.

Where the light-extracting member is a prism 101 as illustrated in FIG. 12A, if necessary, the prism height D1 and the prism width W1 are optimized. Specifically, it is preferred that the prism height D is 0.05 mm to 1 mm and the prism width W is 0.05 mm to 2 mm. The refractive index of media at the light-incident side is n2 and the refractive index of the material forming the prism 101 is n3.

Where the light-extracting member is a lens 102 as illustrated in FIG. 12B, if necessary, the lens height T and the lens diameter 2R are optimized. Specifically, it is preferred that the lens height T is 0.05 mm to 2 mm and the lens diameter 2R is 0.1 mm to 2 mm. The refractive index of media at the light-incident side is n2 and the refractive index of the material forming the lens 102 is n3.

Where the light-extracting member is a fine concavo-convex structure 103 as illustrated in FIG. 12C, if necessary, the height h of the convex and concave portions and the width d of the convex and concave portions are optimized. Specifically, it is preferred that the height h of the convex and concave portions is 0.3 µm to 3 µm and the width d of the convex and concave portions is 0.5 µm to 3 µm. The refractive index of media at the light-incident side is n2 and the refractive index of the material forming the fine concavo-convex structure 103 is n3.

Where the light-extracting member is a fine particle layer 104 as illustrated in FIG. 12D, if necessary, the thickness L of the fine particle layer, the refractive index nb of a polymer of the fine particle layer, the average particle diameter φ of the fine particles, the refractive index np of the fine particles, np≠nb, and the filling rate by volume η of the fine particles are optimized. Specifically, it is preferred that the thickness L of the fine particle layer is 1 µm to 50 µm, the refractive index nb of a polymer of the fine particle layer 104 is equal to or higher than the refractive index n of the organic electroluminescent layer, the average particle diameter φ of the fine particles is 0.5 µm to 10 µm, the refractive index np of the fine particles is 1.4 to 2.6, and the filling rate by volume η of the fine particles is 10% to 50%. The refractive index of media at the light-incident side is n2 and the refractive index nb of a polymer of the fine particle layer 104 (indicated with n3, here).

FIGS. 13A to 13D are each a schematic view of an organic electroluminescent device where the light-extracting member is a prism 101, a lens 102, a fine concavo-convex structure 103 or a fine particle layer 104, and the light distribution-converting member is a fine concavo-convex structure 103. Note that, the refractive index of the organic electroluminescent layer 2 is n.

The refractive index of the fine concavo-convex structure 103 serving as the light distribution-converting member satisfies n1≥n and n2>n1. If necessary, the height h of the convex and concave portions and the width d of the convex and concave portions are optimized. Specifically, it is preferred that the height h of the convex and concave portions is 0.3 µm to 3 µm and the width d of the convex and concave portions is 0.5 µm to 3 µm.

In order for the fine concavo-convex structure serving as the light distribution-converting member to pass through light emitted from an organic electroluminescent layer without totally reflecting the light due to the difference in refractive index, (1) the refractive index n1 of the material of the fine concavo-convex structure serving as the light distribution-converting member is preferably equal to or higher than the refractive index n of the organic electroluminescent layer; i.e., n1≥n, and (2) the refractive index n2 of media at the light-emitted side of the fine concavo-convex structure serving as the light distribution-converting member is preferably higher than the refractive index n1 of the material of the fine concavo-convex structure serving as the light distribution-converting member; i.e., n2>n1.

Figure 13A:
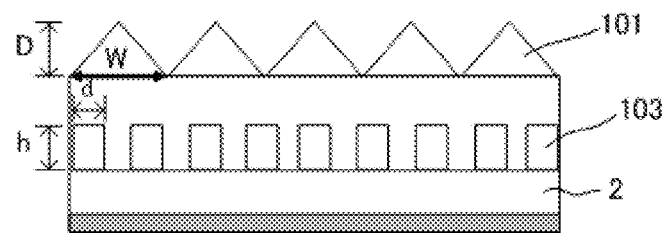
FIG. 13A is a schematic view of an organic electroluminescent device containing a combination of a prism layer (prism array) serving as a light-extracting member and a fine concavo-convex structure serving as a light distribution-converting member.
Figure 13B:
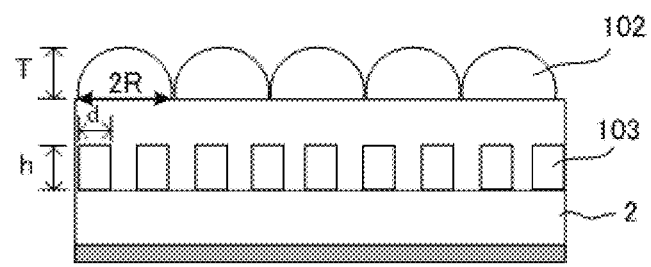
FIG. 13B is a schematic view of an organic electroluminescent device containing a combination of a lens layer (lens array) serving as a light-extracting member and a fine concavo-convex structure serving as a light distribution-converting member.
Figure 13C:
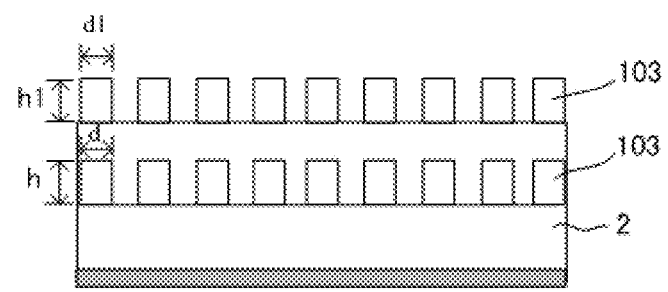
FIG. 13C is a schematic view of an organic electroluminescent device containing a combination of a fine concavo-convex structure serving as a light-extracting member and a fine concavo-convex structure serving as a light distribution-converting member.
Figure 13D:
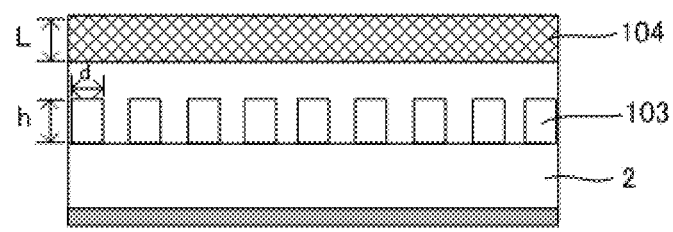
FIG. 13D is a schematic view of an organic electroluminescent device containing a combination of a fine particle layer serving as a light-extracting member and a fine concavo-convex structure serving as a light distribution-converting member.

Considering the production process and cost, the refractive index n3 of the light-extracting member satisfies n3≤n2 or may satisfy n3=n2.

Where the light-extracting member is a prism 101 as illustrated in FIG. 13A, if necessary, the prism height D and the prism width W are optimized. Specifically, it is preferred that the prism height D is 0.05 mm to 1 mm and the prism width W is 0.05 mm to 2 mm. The refractive index of media at the light-incident side is n2 and the refractive index of the material forming the prism 101 is n3.

Where the light-extracting member is a lens 102 as illustrated in FIG. 13B, if necessary, the lens height T and the lens diameter 2R are optimized. Specifically, it is preferred that the lens height T is 0.05 mm to 2 mm and the lens diameter 2R is 0.1 mm to 2 mm. The refractive index of media at the light-incident side is n2 and the refractive index of the material forming the lens 102 is n3.

Where the light-extracting member is a fine concavo-convex structure 103 as illustrated in FIG. 13C, if necessary, the height h1 of the convex and concave portions and the width d1 of the convex and concave portions are optimized. Specifically, it is preferred that the height h of the convex and concave portions is 0.3 µm to 3 µm and the width d of the convex and concave portions is 0.5 µm to 3 µm. The refractive index of media at the light-incident side is n2 and the refractive index of the material forming the fine concavo-convex structure 103 is n3.

Where the light-extracting member is a fine particle layer 104 as illustrated in FIG. 13D, if necessary, the thickness L of the fine particle layer, the refractive index nb of a polymer of the fine particle layer, the average particle diameter φ of the fine particles, the refractive index np of the fine particles, np≠nb, and the filling rate by volume η of the fine particles are optimized. Specifically, it is preferred that the thickness L of the fine particle layer is 1 µm to 50 µm, the refractive index nb of a polymer of the fine particle layer 104 is equal to or higher than the refractive index n of the organic electroluminescent layer, the average particle diameter φ of the fine particles is 0.5 µm to 10 µm, the refractive index np of the fine particles is 1.4 to 2.6, and the filling rate by volume η of the fine particles is 10% to 50%. The refractive index of media at the light-incident side is n2 and the refractive index nb of a polymer of the fine particle layer 104 (indicated with n3, here).

FIGS. 14A to 14D are each a schematic view of an organic electroluminescent device where the light-extracting member is a prism 101, a lens 102, a fine concavo-convex structure 103 or a fine particle layer 104, and the light distribution-converting member is a fine particle layer 104. Note that, the refractive index of the organic electroluminescent layer 2 is n.

The refractive index of the fine particle layer 104 serving as the light distribution-converting member satisfies n1≥n or may satisfy n2=n1. If necessary, the thickness L of the fine particle layer, the refractive index nb of a polymer of the fine particle layer, the refractive index np of the fine particles, np≠nb, the average particle diameter φ of the fine particles, and the filling rate by volume η of the fine particles are optimized. Specifically, it is preferred that the thickness L of the fine particle layer is 1 µm to 50 µm, the refractive index nb of a polymer of the fine particle layer is equal to or higher than the refractive index n of the organic electroluminescent layer, the average particle diameter φ of the fine particles is 0.5 µm to 10 µm, the refractive index np of the fine particles is 1.4 to 2.6, and the filling rate by volume η of the fine particles is 10% to 50%.

In order for the fine particle layer serving as the light distribution-converting member to pass through light emitted from an organic electroluminescent layer without totally reflecting the light due to the difference in refractive index, (1) the refractive index n1 of the material forming the fine particle layer serving as the light distribution-converting member is preferably equal to or higher than the refractive index n of the organic electroluminescent layer; i.e., n1≥n, (2) considering the production process and cost, the refractive index n2 of media at the light-emitted side is preferably equal to n1; i.e., n2=n1, and (3) where the light-extracting member is any of a prism, a lens, a fine concavo-convex structure, and a fine particle layer, the relationship n3=n2=n1 is acceptable, and thus the fine particle layer is most preferably used as the light distribution-converting member.

Figure 14A:
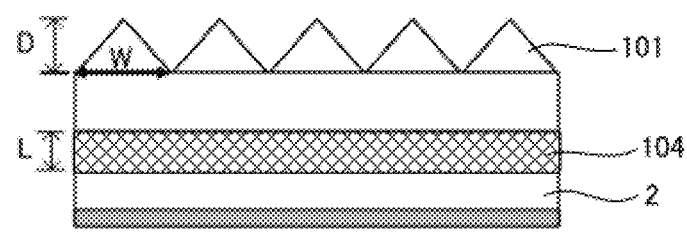
FIG. 14A is a schematic view of an organic electroluminescent device containing a combination of a prism layer (prism array) serving as a light-extracting member and a fine particle layer serving as a light distribution-converting member.
Figure 14B:
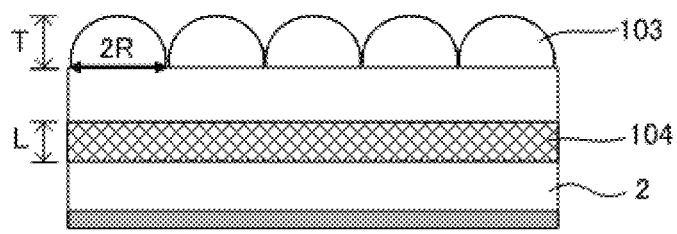
FIG. 14B is a schematic view of an organic electroluminescent device containing a combination of a lens layer (lens array) serving as a light-extracting member and a fine particle layer serving as a light distribution-converting member.
Figure 14C:
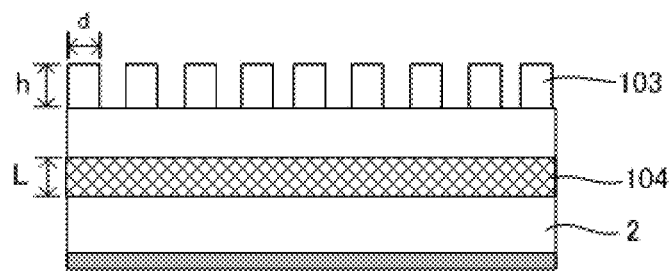
FIG. 14C is a schematic view of an organic electroluminescent device containing a combination of a fine concavo-convex structure serving as a light-extracting member and a fine particle layer serving as a light distribution-converting member.
Figure 14D:
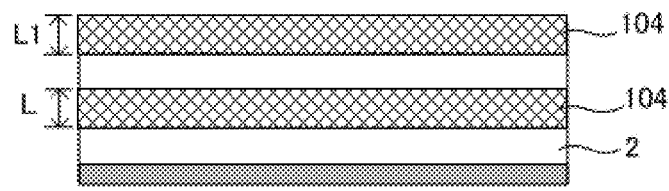
FIG. 14D is a schematic view of an organic electroluminescent device containing a combination of a fine particle layer serving as a light-extracting member and a fine particle layer serving as a light distribution-converting member.

The refractive index n3 of the light-extracting member satisfies n3≤n2, and considering the production process, the refractive index n3 may satisfy n3=n2.

Where the light-extracting member is a prism 101 as illustrated in FIG. 14A, if necessary, the prism height D and the prism width W are optimized. Specifically, it is preferred that the prism height D is 0.05 mm to 1 mm and the prism width W is 0.05 mm to 2 mm. The refractive index of media at the light-incident side is n2 and the refractive index of the material forming the prism 101 is n3.

Where the light-extracting member is a lens 102 as illustrated in FIG. 14B, if necessary, the lens height T and the lens diameter 2R are optimized. Specifically, it is preferred that the lens height T is 0.05 mm to 2 mm and the lens diameter 2R is 0.1 mm to 2 mm. The refractive index of media at the light-incident side is n2 and the refractive index of the material forming the lens 102 is n3.

Where the light-extracting member is a fine concavo-convex structure 103 as illustrated in FIG. 14C, if necessary, the height h of the convex and concave portions and the width d of the convex and concave portions are optimized. Specifically, it is preferred that the height h of the convex and concave portions is 0.3 µm to 3 µm and the width d of the convex and concave portions is 0.5 µm to 3 µm. The refractive index of media at the light-incident side is n2 and the refractive index of the material forming the fine concavo-convex structure 103 is n3.

Where the light-extracting member is a fine particle layer 104 as illustrated in FIG. 14D, if necessary, the thickness L1 of the fine particle layer, the refractive index nb1 of a polymer of the fine particle layer, the average particle diameter φ1 of the fine particles, the refractive index np1 of the fine particles, np1≠nb1, and the filling rate by volume η1 of the fine particles are optimized. Specifically, it is preferred that the thickness L1 of the fine particle layer is 1 µm to 50 µm, the refractive index nb1 of a polymer of the fine particle layer is equal to or higher than the refractive index n of the organic electroluminescent layer, the average particle diameter φ1 of the fine particles is 0.5 µm to 10 µm, the refractive index np1 of the fine particles is 1.4 to 2.6, and the filling rate by volume η1 of the fine particles is 10% to 50%. The refractive index of media at the light-incident side is n2 and the refractive index nb of a polymer of the fine particle layer 104 (indicated with n3, here).

Figure 15A:
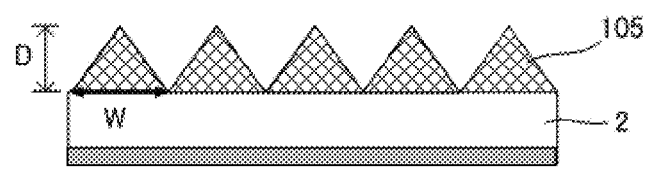
FIG. 15A is a schematic view of an organic electroluminescent device containing a light-extracting member and light distribution-converting member is a united structure of a prism layer (prism array) and a fine particle layer.
Figure 15B:
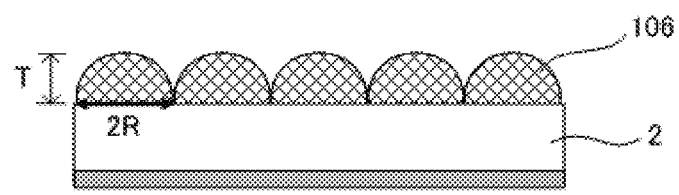
FIG. 15B is a schematic view of an organic electroluminescent device containing a light-extracting member and light distribution-converting member is a united structure of a lens layer (lens array) and a fine particle layer.
Figure 15C:
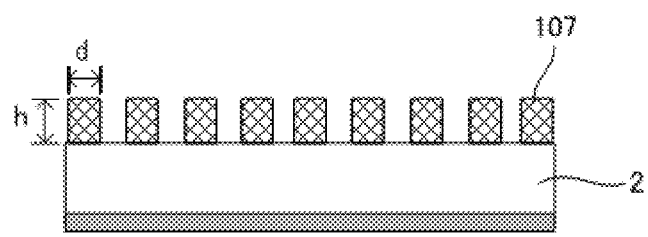
FIG. 15C is a schematic view of an organic electroluminescent device containing a light-extracting member and light distribution-converting member is a united structure of a fine concavo-convex structure and a fine particle layer.

FIGS. 15A to 15C are each a schematic view of an organic electroluminescent device where the light-extracting member is a prism, a lens or a fine concavo-convex structure, the light distribution-converting member is a fine particle layer, and the light-extracting member and the light distribution-converting member are united to have a structure 105, 106 or 107. Note that, the refractive index of the organic electroluminescent layer 2 is n.

In the united structure of the light-extracting member and the light distribution-converting member, in order to avoid total reflection of light to enter the light-extracting member, the refractive index nb of a polymer of the fine particle layer is preferably equal to or higher than the refractive index n of the organic electroluminescent layer; i.e., nb≥n.

If necessary, the refractive index nb of a polymer of the fine particle layer, the refractive index np of the fine particles, np≠nb, the average particle diameter φ of the fine particles, and the filling rate by volume η of the fine particles are optimized. Specifically, it is preferred that the thickness L of the fine particle layer is 1 μm to 50 μm, the refractive index nb of a polymer of the fine particle layer is equal to or higher than the refractive index n of the organic electroluminescent layer, the average particle diameter φ of the fine particles is 0.5 μm to 10 μm, the refractive index np of the fine particles is 1.4 to 2.6, and the filling rate by volume η of the fine particles is 10% to 50%.

The size of the prism, lens or fine concavo-convex structure serving as the light-extracting member is optimized.

Where the united structure of the light-extracting member and the light distribution-converting member is a prism+fine particle layer 105 as illustrated in FIG. 15A, the prism height D and the prism width W are optimized. Specifically, it is preferred that the prism height D is 0.05 mm to 1 mm and the prism width W is 0.05 mm to 2 mm.

Where the united structure of the light-extracting member and the light distribution-converting member is a lens+fine particle layer 106 as illustrated in FIG. 15B, the lens height T and the lens diameter 2R are optimized. Specifically, it is preferred that the lens height T is 0.05 mm to 2 mm and the lens diameter 2R is 0.1 mm to 2 mm.

Where the united structure of the light-extracting member and the light distribution-converting member is a fine concavo-convex structure+fine particle layer 107 as illustrated in FIG. 15C, the height h of the concave and convex portions and the width d of the concave and convex portions are optimized. Specifically, it is preferred that the height h of the concave and convex portions is 0.3 μm to 3 μm and the width d of the concave and convex portions is 0.5 μm to 3 μm.

<Reflective Electrode>

The reflective electrode is an electrode disposed on the opposite side to the side where light is extracted. The reflective electrode has a function of reflecting light emitted from the organic electroluminescent layer.

As a material for the reflective electrode, silver (Ag) is suitably used from the viewpoint of reflectivity. When other metals than silver (Ag) such as MgAg and Al are used for the reflective electrode, there may be a case where light extraction efficiency cannot be improved. When the reflective electrode is made of silver (Ag), there may be an Al or LiF layer having an optically negligible thickness (10 nm or smaller) between the reflective electrode and an electron transport layer in order to improve electrical properties.

The reflective electrode is formed by, for example, a vacuum vapor deposition method, an electron beam method, a sputtering method, a resistance heating evaporation method or a coating method.

The thickness of the reflective electrode is not particularly limited and may be appropriately selected depending on the intended purpose, but is preferably 10 nm to 5 μm, more preferably 50 nm to 1 μm, further preferably 100 nm to 1 μm.

<Transparent Substrate>

The refractive index of the transparent substrate is preferably equal to or higher than the refractive index of the organic electroluminescent layer. When the refractive index of the transparent substrate is higher than the refractive index of the organic electroluminescent layer, light emitted from the organic electroluminescent layer is reflected between the transparent substrate and the reflective electrode. As the emitted light travels therebetween, some components thereof are absorbed and lost in the organic electroluminescent layer and the reflective electrode, leading to a drop in light extraction efficiency. Also, when the refractive index of the transparent substrate is high, total reflection occurs between the transparent substrate and the fine particle layer to make it impossible to extract light, unless the refractive index of a polymer of the fine particle layer is as high as the refractive index of the transparent substrate. When the refractive index of a polymer of the fine particle layer is higher, the difference in refractive index is greater between the transparent substrate and the air or between the fine particle layer and the air. As a result, back-scattered light increases and more components are absorbed and lost in the fine particle layer and the reflective electrode as the light travels therebetween, leading to a drop in light extraction efficiency. Since a polymer for a transparent substrate or a fine particle layer having a refractive index of 1.95 or higher is expensive and also its production process is complicated, the refractive index of the transparent substrate is more preferably equal to the refractive index of the organic electroluminescent layer.

The refractive index of the transparent substrate is preferably equal to the refractive index of a polymer of the fine particle layer from the viewpoint of preventing interlayer reflection and total reflection.

The refractive index of the transparent substrate depends on a material used and cannot flatly be determined. For example, in the case of glass, the refractive index thereof is preferably 1.55 to 1.95.

The shape, structure, size, etc. of the transparent substrate are not particularly limited and may be appropriately selected. In general, the shape of the transparent substrate is preferably a sheet. The structure of the transparent substrate may be a single-layered structure or a multi-layered structure, and may be a single member or a combination of two or more members. The transparent substrate may be colorless transparent or colored transparent. Preferably, the transparent substrate is colorless transparent since light emitted from the organic electroluminescent layer is not scattered or attenuated.

A material for the transparent substrate is not particularly limited and may be appropriately selected depending on the intended purpose. Examples thereof include: inorganic materials such as yttria-stabilized zirconia (YSZ) and glass; and organic materials such as polyester resins (e.g., polyethylene terephthalate resins, polybutylene phthalate resins and polyethylene naphthalate resins), polystyrene resins, polycarbonate resins, polyether sulfone resins, polyarylate resins, polyimide resins, polycycloolefin resins, norbornene resins and poly(chlorotrifluoroethylene) resins. These may be used alone or in combination.

When glass is used for the transparent substrate, the glass used is preferably alkali-free glass for reducing ions eluted from glass. When soda-lime glass is used for the substrate, the soda-lime glass used is preferably provided with a barrier coat of, for example, silica (e.g., a barrier film substrate). When organic materials are used for the substrate, the organic materials used are preferably excellent in heat resistance, dimensional stability, solvent resistance, electrical insulating property and processability.

When a thermoplastic substrate is used, the thermoplastic substrate may further be provided with, for example, a hard coat layer and an under coat layer, if necessary.

Among them, the material for the substrate is particularly preferably transparent glass, quartz, sapphire, and transparent synthetic resins such as polyesters, polyacrylates, polycarbonates and polyether ketones.

The thickness of the transparent substrate is not particularly limited and may be appropriately selected depending on the intended purpose so long as it is enough to keep its mechanical strength. When glass is used for the transparent substrate, the thickness of the transparent substrate is preferably 0.2 mm or greater, more preferably 0.7 mm or greater.

<Organic Electroluminescent Layer>

The organic electroluminescent layer includes at least a light-emitting layer and a transparent electrode; and, if necessary, may include a hole injection layer, a hole transport layer, an electron injection layer, an electron transport layer, and other layers. Each of these layers may be provided with another function. Each layer may be formed using various kinds of materials.

—Light-Emitting Layer—

A material for the light-emitting layer is not particularly limited and may be selected depending on the intended purpose. Examples thereof include those capable of forming layers which have functions of, when an electric potential is applied, injecting holes from an anode, a hole injection layer, and a hole transport layer, injecting electrons from a cathode, an electron injection layer, and an electron transport layer, transporting injected charges, and providing a place for the recombination of electrons and holes causing light emission.

A material for the light-emitting layer is not particularly limited and may be appropriately selected depending on the intended purpose. Examples thereof include benzoxazole derivatives, benzimidazole derivatives, benzothiazole derivatives, styrylbenzen derivatives, polyphenyl derivatives, diphenylbutadiene derivatives, tetraphenyl butadiene derivatives, naphthalimide derivatives, coumarin derivatives, perylene derivatives, perinone derivatives, oxadiazol derivatives, aldazine derivatives, pyralidine derivatives, cyclopentadiene derivatives, bis(styryl)anthracene derivatives, quinacridone derivatives, pyrrolopyridine derivatives, thiadiazolepyridine derivatives, cyclopentadiene derivatives, styrylamine derivatives, aromatic dimethyldine compounds, various metal complexes such as metal/rare metal complexes of 8-quinolinol derivatives, and polymer compounds such as polythiophene, polyphenylene, and polyphenylene vinylene. These may be used alone or in combination.

The thickness of the light-emitting layer is not particularly limited and may be selected depending on the intended purpose. The thickness is preferably 1 nm to 5 μm, more preferably 5 nm to 1 μm, still more preferably 10 nm to 500 nm.

A method for forming the light-emitting layer is not particularly limited and may be appropriately selected depending on the intended purpose. Preferred examples thereof include vapor deposition through resistive heating, electron-beam methods, sputtering, molecular-layering methods, and coating methods (e.g., spin-coat methods), cast methods and dip-coat methods) and LB methods. Among them, vapor deposition through resistive heating and coating methods are particularly preferred.

—Transparent Electrode—

A material for the transparent electrode is not particularly limited and may be appropriately selected depending on the intended purpose. Examples thereof include tin-doped indium oxide (ITO) (refractive index (n)=2.0), zinc-doped indium oxide (IZO), ZnO (refractive index (n)=1.95), $SnO_2$ (refractive index (n)=2.0), $In_2O_3$ (refractive index (n)=1.9 to 2.0) and $TiO_2$ (refractive index (n)=1.90), with ITO and IZO being particularly preferred.

The refractive index of the transparent electrode is preferably 1.65 to 2.2.

The average thickness of the transparent electrode is preferably 20 nm to 200 nm, more preferably 40 nm to 100 nm.

—Hole Injection Layer, Hole Transport Layer—

A material for the hole injection layer or the hole transport layer is not particularly limited and may be appropriately selected depending on the intended purpose so long as it possesses any of the following functions: a function of injecting holes from an anode, a function of transporting holes, and a function of blocking electrons injected from a cathode.

Examples of the material for the hole injection layer or the hole transport layer include carbazole derivatives, triazole derivatives, oxazole derivatives, oxidiazole derivatives, imidazole derivatives, poly(aryl alkane) derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stylben derivatives, silazane derivatives, aromatic tertiary amine compounds, styrylamine compounds, aromatic dimethylidine-derived compounds, porphyrin-derived compounds, polysilane-derived compounds, poly(N-vinylcarbazole) derivatives, aniline-derived copolymers, thiophene oligomers, and electro-conductive polymeric oligomers (e.g., polythiophene). These may be used alone or in combination.

The hole injection layer or the hole transport layer may be of either single-layer structure made of one or two or more of the aforementioned materials, or multi-layer structure made of a plurality of layers identical to or different from one another in composition.

Examples of the method for forming the hole injection layer or the hole transport layer include vapor deposition methods, LB methods, and methods by coating a solution or dispersion liquid prepared by dissolving or dispersing the aforementioned hole injection/transport materials in a solvent (e.g., spin-coat methods, cast methods and dip-coat methods). In the cases of these coating methods, the hole injection/transport materials may be dissolved or dispersed in a solvent together with a resin component.

The resin component is not particularly limited and may be appropriately selected depending on the intended purpose. Examples thereof include polyvinylchloride resins, polycarbonate resins, polystyrene resins, polymethyl methacrylate resins, polybutyl methacrylate resins, polyester resins, polysulfone resins, polyphenylene oxide resins, polybutadiene, poly(N-vinylcarbazol) resins, hydrocarbon resins, ketone resins, phenoxy resins, polyamide resins, ethyl cellulose, vinyl acetate resins, ABS resins, polyurethane resins, melamine resins, unsaturated polyester resins, alkyd resins, epoxy resins, and silicone resins. These may be used alone or in combination.

The thickness of the hole injection layer or the hole transport layer is not particularly limited and may be appropriately selected depending on to the intended purpose. The thickness thereof is preferably 1 nm to 5 μm, more preferably 5 nm and 1 μm, still more preferably 10 nm to 500 nm.

—Electron Injection Layer, Electron Transport Layer—

The material for the electron injection layer or the electron transport layer is not particularly limited and may be appropriately selected depending on the intended purpose so long as it possesses any of the following functions: a function of injecting electrons from a cathode, a function of transporting electrons, and a function of blocking holes injected from an anode.

Examples of the material for the electron injection layer or the electron transport layer include triazole derivatives, oxazole derivatives, oxidiazole derivatives, fluorenone derivatives, anthraquinodimethane derivatives, anthrone derivatives, diphenylquinone derivatives, thiopyran dioxide derivatives, carbodiimide derivatives, fluorenylidene methane derivatives, distyrylpyradine derivatives, heterocyclic tetracarboxylic anhydride (e.g., naphthalene and perylene), phthalocyanine derivatives, and various metal complexes represented by metal complexes of 8-quinolinol derivatives, metal phthalocyanine, and metal complexes containing benzoxazole or benzothiazole as a ligand. These may be used alone or in combination.

The electron injection layer or the electron transport layer may be of either single-layer structure made of one or two or more of the aforementioned materials, or multi-layer structure made of a plurality of layers identical to or different from one another in composition.

Examples of the method for forming the electron injection layer or the electron transport layer include vapor-deposition methods, LB methods, and methods by coating a solution or dispersion liquid prepared by dissolving or dispersing the aforementioned hole injection/transport materials in a solvent (e.g., spin-coat methods, cast methods and dip-coat methods). In the cases of these coating methods, the hole injection/transport materials may be dissolved or dispersed in a solvent together with a resin component. As for the resin component, the resins exemplified for the hole injection/ transport layers may be used.

The thickness of the electron injection layer or the electron transport layer is not particularly limited and may be appropriately selected depending on the intended purpose. The thickness thereof is preferably 1 nm to 5 μm, more preferably 5 nm to 1 μm, still more preferably 10 nm to 500 nm.

—Other Members—

Examples of the other members include a barrier layer, a protective layer, a seal layer and a TFT substrate.

The barrier layer is not particularly limited and may be appropriately selected depending on the intended purpose so long as it has a function of preventing permeation of atmospheric oxygen, moisture, nitrogen oxides, sulfur oxides, ozone, and the like.

The material for the barrier layer is not particularly limited and any material may be appropriately selected depending on the intended purpose. Examples thereof include SiN and SiON.

The thickness of the barrier layer is not particularly limited and may be appropriately selected depending on the intended purpose. The thickness thereof is preferably 5 nm to 1,000 nm, more preferably 7 nm to 750 nm, particularly preferably 10 nm to 500 nm.

When the thickness of the barrier layer is less than 5 nm, the barrier function of preventing permeation of atmospheric oxygen and moisture may be insufficient. Whereas when the thickness thereof is greater than 1,000 nm, the light transmittance decreases, potentially degrading transparency.

Among optical characteristics of the barrier layer, the light transmittance is preferably 80% or more, more preferably 85% or more, still more preferably 90% or more.

The method for forming the barrier layer is not particularly limited and may be appropriately selected depending on the intended purpose. Examples thereof include CVD methods.

An organic electroluminescent device of the present invention may be configured as a device that can display a full-color image.

As a method for forming a full color-type display of the organic electroluminescent device of the present invention, there are known, for example, as described in "Monthly Display," September 2000, pp. 33 to 37, a tricolor light emission method by arranging, on a substrate, organic EL devices emitting lights corresponding to three primary colors (blue color (B), green color (G) and red color (R)); a white color method by separating white light emitted from an organic EL device for white color emission into three primary colors through a color filter; and a color conversion method by converting a blue light emitted from an organic EL device for blue light emission into red color (R) and green color (G) through a fluorescent dye layer.

Furthermore, by combining a plurality of layer structures emitting lights of different colors which are obtained by the above-described methods, plane-type light sources emitting lights of desired colors can be obtained. For example, there are exemplified white light-emitting sources obtained by combining blue and yellow light emitting devices, and white light-emitting sources obtained by combining blue, green and red light-emitting devices.

Figure 9:
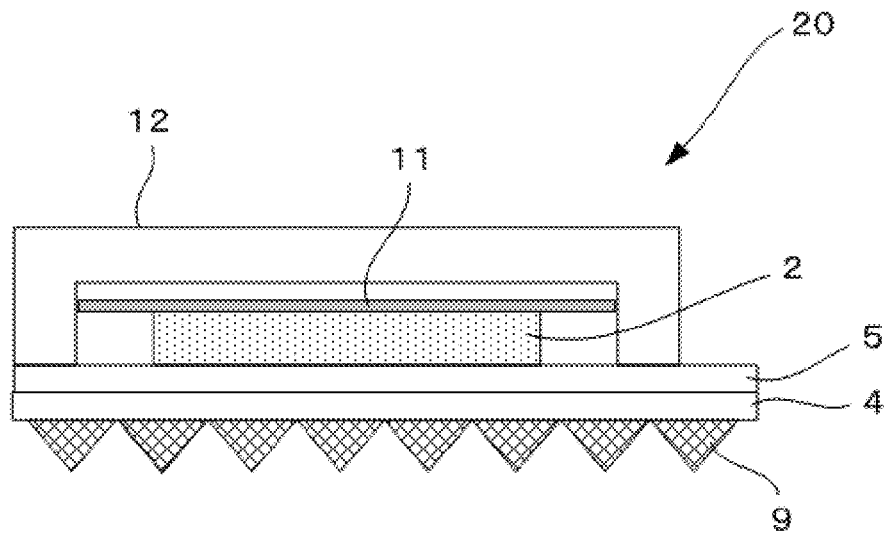
FIG. 9 is a schematic view of an organic electroluminescent device produced in Example 3.

Here, FIG. 9 is a schematic view of one example of an organic electroluminescent device 20 of the present invention.

The organic electroluminescent device 20 of FIG. 9 includes a transparent substrate 4 and a united member 9 of a prism layer and a fine particle layer on the light-emitting surface of a transparent electrode 5.

In addition, the organic electroluminescent device 20 further includes an organic electroluminescent layer 2 and a reflective electrode 11 on the transparent electrode 3, which are sealed by a seal can 12.

Figure 10:
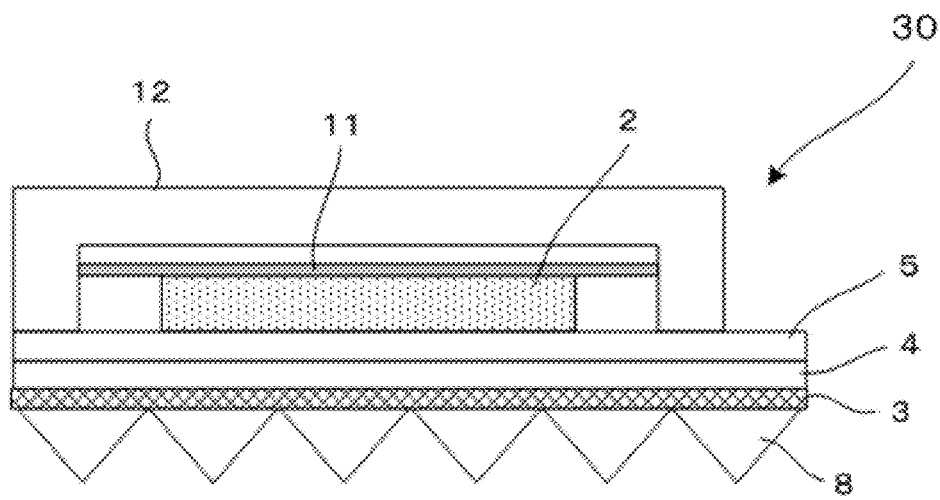
FIG. 10 is a schematic view of an organic electroluminescent device produced in Example 4.

FIG. 10 is a schematic view of another example of an organic electroluminescent device 30 of the present invention.

The organic electroluminescent device 30 of FIG. 10 includes a transparent substrate 4, a fine particle layer 3 and a prism layer 8 on the light-emitting surface of a transparent electrode 5.

In addition, the organic electroluminescent device 30 further includes an organic electroluminescent layer 2 and a reflective electrode 11 on the transparent electrode 3, which are sealed by a seal can 12.

The organic electroluminescent device of the present invention can be suitably used in various fields, such as various lights, computers, displays for automobiles, outdoor displays, domestic and commercial devices, domestic appliances, transportation-related displays, clock displays, calendar displays, luminescent screens and audio devices.

EXAMPLES

The present invention will next be described by way of Examples, which should not be construed as limiting the present invention thereto.

Example 1

Using the below-described model, simulation was performed in the following manner with commercially available ray-tracing software (ZEMAX-EE, product of ZEMAX Development Corporation).

<Simulation Model 1>

Figure 3A:
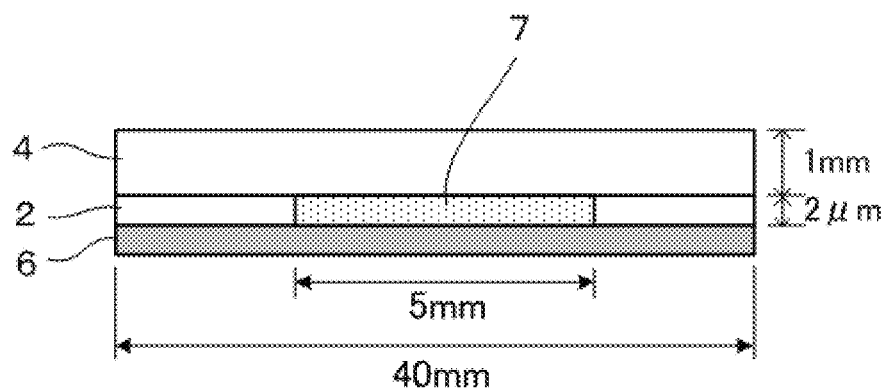
FIG. 3A is a schematic view of simulation model 1 of an organic electroluminescent device used in Examples, where a light-extracting unit is absent.

FIG. 3A is a structure of a basic organic electroluminescent device, which is a standard model used for calculating an increase factor of light extraction efficiency:

Air/transparent substrate 4 (BK7, product of OHARA INC., refractive index n=1.5, attenuation coefficient k=0, thickness=1 mm)/organic electroluminescent layer 2 (refractive index n=1.8, attenuation coefficient k=0, thickness: 2 µm, effective light-emitting region: 5 mm×5 mm)/composite reflective layer 6 (reflective electrode Al, reflectance: 0.86× 0.9=0.77, thickness: 100 nm).

The light extraction efficiency of the simulation model 1 of FIG. 3A was about 30%.

<Simulation Model 2>

Figure 3B:
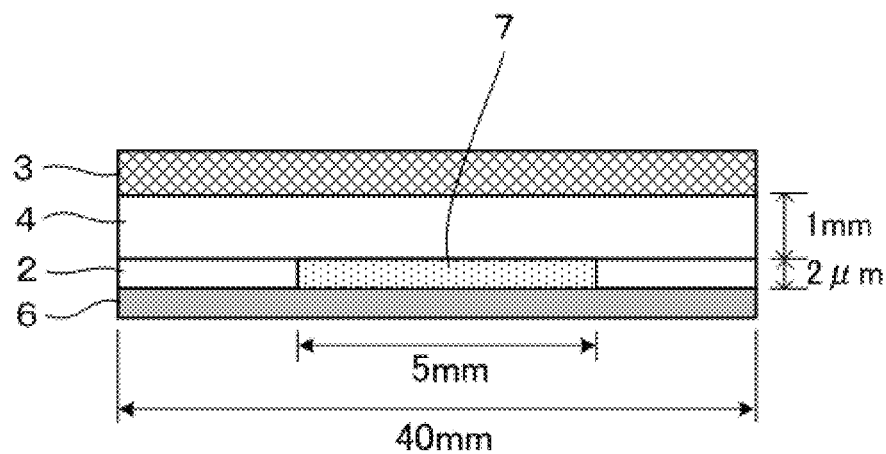
FIG. 3B is a schematic view of simulation model 2 of an organic electroluminescent device used in Examples, where a light-extracting unit is a fine particle layer.

FIG. 3B is a simulation model of an organic electroluminescent device containing a fine particle layer as a light-extracting unit:

Air/fine particle layer 3 (polymer:refractive index nb=1.8, attenuation coefficient k=0, average particle diameter φ of the fine particles: 6 µm, the thickness of the fine particle layer: L, filling rate by volume η)/transparent substrate 4 (refractive index: ns, attenuation coefficient k=0, thickness: 1 mm)/organic electroluminescent layer 2 (refractive index n=1.8, attenuation coefficient k=0, thickness: 2 µm, effective light-emitting region: 5 mm×5 mm)/composite reflective layer 6 (reflective electrode Ag, 0.97×0.9=0.87, thickness: 100 nm).

The fine particles used were polystyrene spherical particles (refractive index n=1.59, attenuation coefficient k=0). The polymer used in the fine particle layer was a dispersion where high-refractive-index nanoparticles (TiO$_2$, refractive index n=2.6, average particle diameter: 100 nm or less) were properly dispersed in urethane (refractive index n=1.5).

As a result of studying the thickness L of the fine particle layer and the filling rate by volume η of the fine particles, the light extraction efficiency was maximum when the thickness L of the fine particle layer was 30 µm and the filling rate by volume η of the fine particles was 50%. The increase factor of the light extraction efficiency of the simulation model 2 of FIG. 3B was about 2.05 relative to the light extraction efficiency of the simulation model 1 of FIG. 3A.

<Simulation Model 3>

Figure 3C:
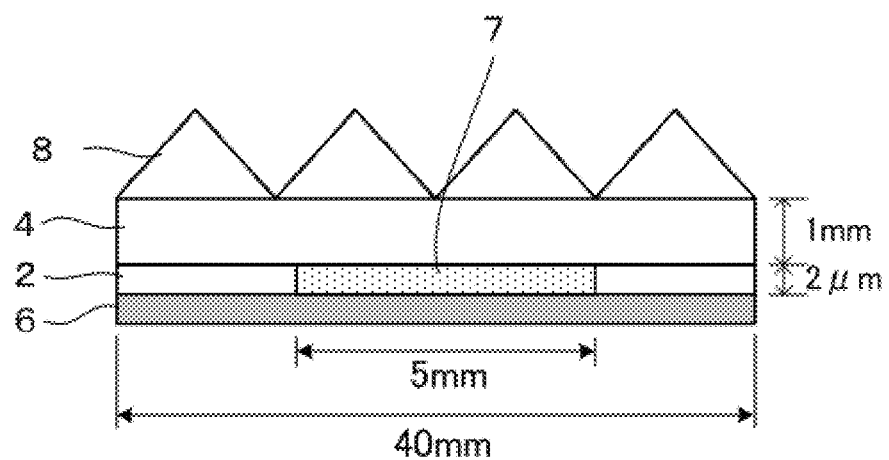
FIG. 3C is a schematic view of simulation model 3 of an organic electroluminescent device used in Examples, where a light-extracting unit is a prism layer (prism array).

FIG. 3C is a simulation model of an organic electroluminescent device containing a prism layer as a light-extracting unit:

Air/prism layer 8 (matter filled therein: polymer:refractive index nb=1.8, attenuation coefficient k=0, base: 2 mm×2 mm, apex angle: 90°)/transparent substrate 4 (refractive index: ns, attenuation coefficient k=0, thickness: 1 mm)/organic electroluminescent layer 2 (refractive index n=1.8, attenuation coefficient k=0, thickness: 2 µm, effective light-emitting region: 5 mm×5 mm)/composite reflective layer 6 (reflective electrode Ag, 0.97×0.9=0.87, thickness: 100 nm).

The maximum increase factor of the light extraction efficiency of the simulation model 3 of FIG. 3C was 2.03 relative to the light extraction efficiency of the simulation model 1 of FIG. 3A.

<Simulation Model 4>

Figure 3D:
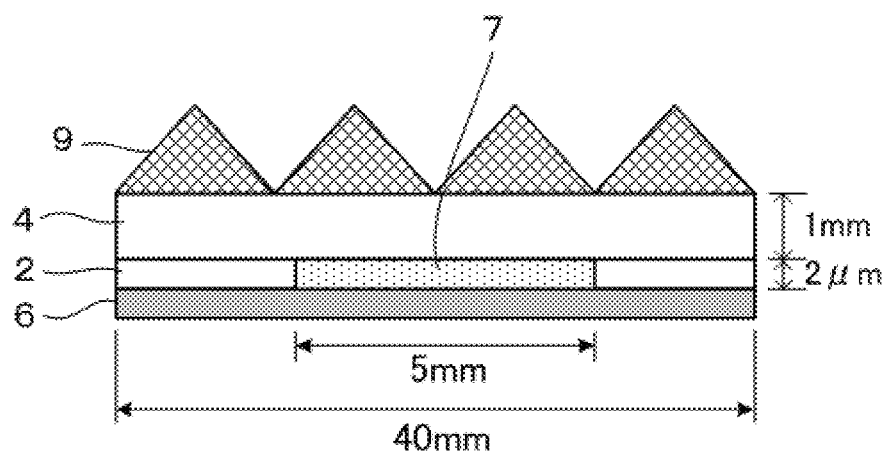
FIG. 3D is a schematic view of simulation model 4 of an organic electroluminescent device used in Example 1, where a light-extracting unit is a united structure of a light-extracting member and a light distribution-converting member.

FIG. 3D is a simulation model of an organic electroluminescent device containing a united layer of a prism layer and a fine particle layer as a light-extracting unit:

Air/united member 9 of prism layer and fine particle layer (base: 2 mm×2 mm, apex angle: 90°, matter filled therein: polymer containing fine particles: refractive index nb=1.8, attenuation coefficient k=0, average particle diameter p of the fine particles: 6 µm or 10 µm, filling rate by volume η)/transparent substrate 4 (refractive index ns=1.8, attenuation coefficient k=0, thickness: 1 mm)/organic electroluminescent layer 2 (refractive index n=1.8, attenuation coefficient k=0, thickness: 2 µm, effective light-emitting region: 5 mm×5 mm)/composite reflective layer 6 (reflective electrode Ag, 0.97×0.9=0.87, thickness: 100 nm).

The fine particles used were polystyrene spherical particles (refractive index n=1.59, attenuation coefficient k=0). The polymer used in the fine particle layer was a dispersion where high-refractive-index nanoparticles (TiO$_2$, refractive index n=2.6, average particle diameter: 100 nm or less) were properly dispersed in urethane (refractive index n=1.5).

<Simulation Results>

Figure 4:
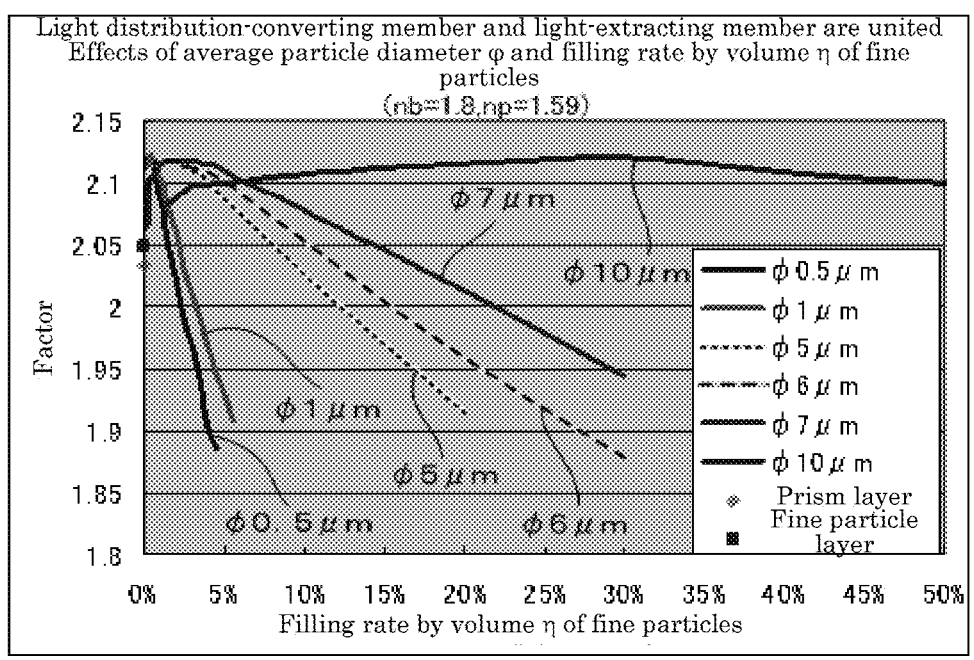
FIG. 4 is a graph of the relationship between particle diameter and filling rate by volume of fine particles and increase factor of light extraction efficiency in Example 1.
Figure 5:
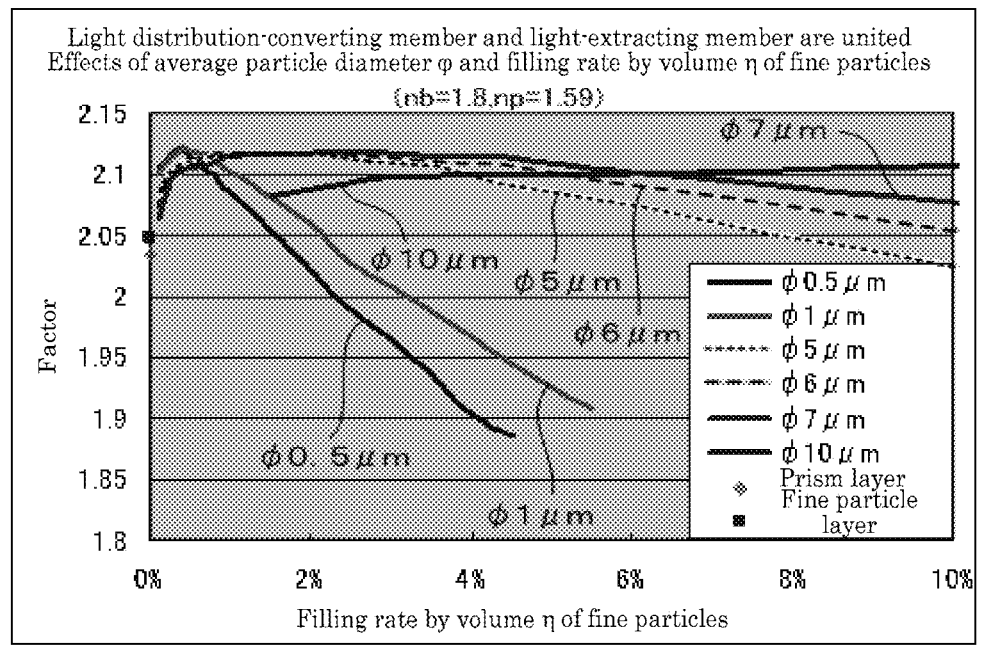
FIG. 5 is an enlarged graph of FIG. 4.

FIGS. 4 and 5 present the relationship between the filling rate by volume of the fine particles and the maximum increase factor of the light extraction efficiency. The results of FIGS. 4 and 5 indicate that the simulation model 4 (FIG. 3D; using the united layer of a prism layer and a fine particle layer) increases in light extraction efficiency compared with the simulation model 2 (FIG. 3B; using the fine particle layer) and the simulation model 3 (FIG. 3C; using the prism layer).

The results of FIGS. 4 and 5 also indicate that the average particle diameter φ of the fine particles is preferably 0.5 µm to 10 µm and the filling rate by volume η of the fine particles is preferably 0.1% to 50% and that the filling rate by volume η of the fine particles is further preferably 0.1% to 10% when the average particle diameter φ of the fine particles is 0.5 µm to 7 µm.

Within this rage, it is possible to form an optimal light distribution-converting member with the filling rate by volume η of the fine particles of 10% or less or even lower filling rate by volume η of the fine particles. As the filling rate by volume of the fine particles becomes higher, the fine particles are easy to aggregate, making impossible to obtain a light distribution-converting member as designed.

From the above results, it has been found that optimal conditions when the light distribution-converting member and the light-extracting member are united with each other are that the average particle diameter φ of the fine particles is 1 µm, the filling rate by volume η of the fine particles is 0.5%, the prism height D is 0.1 mm and the prism width W is 0.2 mm.

Example 2

Using the below-described model, simulation was performed in the following manner with commercially available ray-tracing software (ZEMAX-EE, product of ZEMAX Development Corporation).

<Simulation Model 5>

Figure 3E:
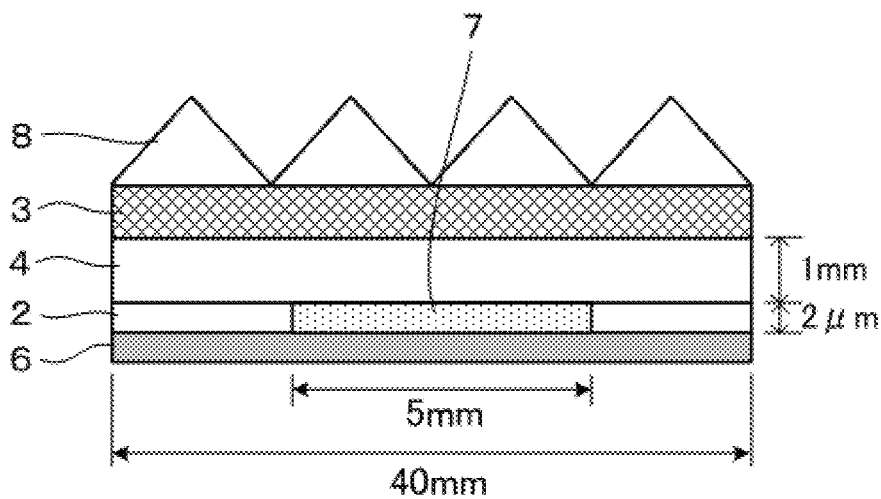
FIG. 3E is a schematic view of simulation model 5 of an organic electroluminescent device used in Example 2, where a light-extracting unit is a united structure of a light-extracting member and a light distribution-converting member.

FIG. 3E is a simulation model of an organic electroluminescent device containing a prism layer and a fine particle layer as a light-extracting unit:

Air/prism layer 8 (matter filled therein: polymer:refractive index nb=1.8, attenuation coefficient k=0, base: 2 mm×2 mm, apex angle: 90°)/fine particle layer 3 (polymer:refractive index nb=1.8, attenuation coefficient k=0, average particle diameter φ of the fine particles: 6 µm, the thickness of the fine particle layer: L, filling rate by volume η)/transparent substrate 4 (refractive index: ns, attenuation coefficient k=0, thickness: 1 mm)/organic electroluminescent layer 2 (refractive index n=1.8, attenuation coefficient k=0, thickness: 2 µm, effective light-emitting region: 5 mm×5 mm)/ composite reflective layer 6 (reflective electrode Ag, 0.97× 0.9=0.87, thickness: 100 nm).

The fine particles used were polystyrene spherical particles (refractive index n=1.59, attenuation coefficient k=0). The polymer used in the fine particle layer was a dispersion where high-refractive-index nanoparticles (TiO$_2$, refractive index n=2.6, average particle diameter: 100 nm or less) were properly dispersed in urethane (refractive index n=1.5).

<Simulation Results>

Figure 6:
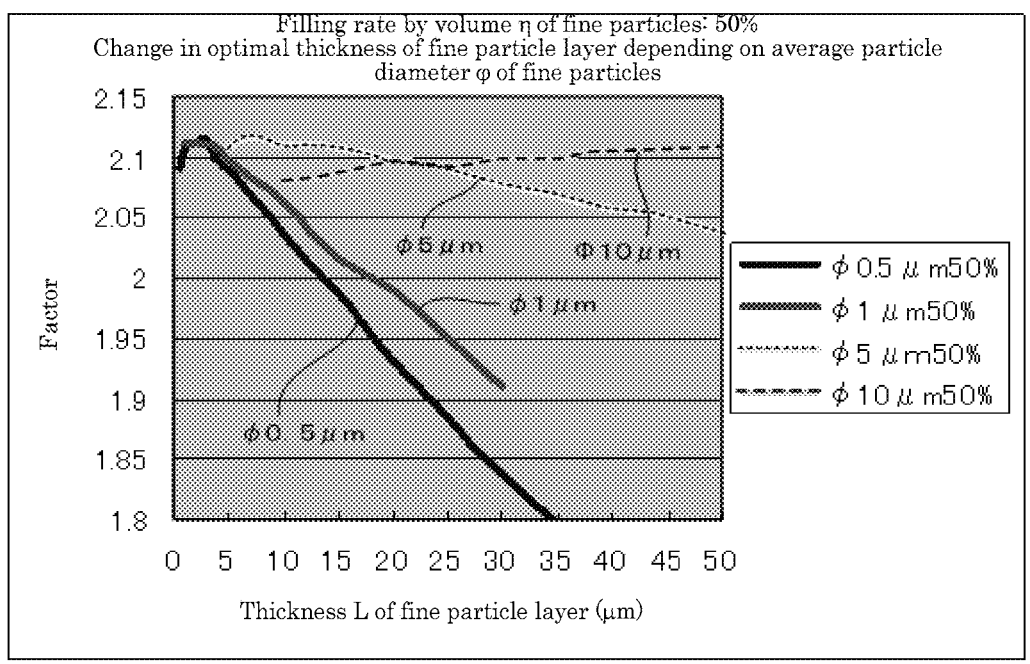
FIG. 6 is a graph of the relationship between thickness of a fine particle layer and increase factor of light extraction efficiency when the filling rate by volume of fine particles is 50% in Example 2.
Figure 7:
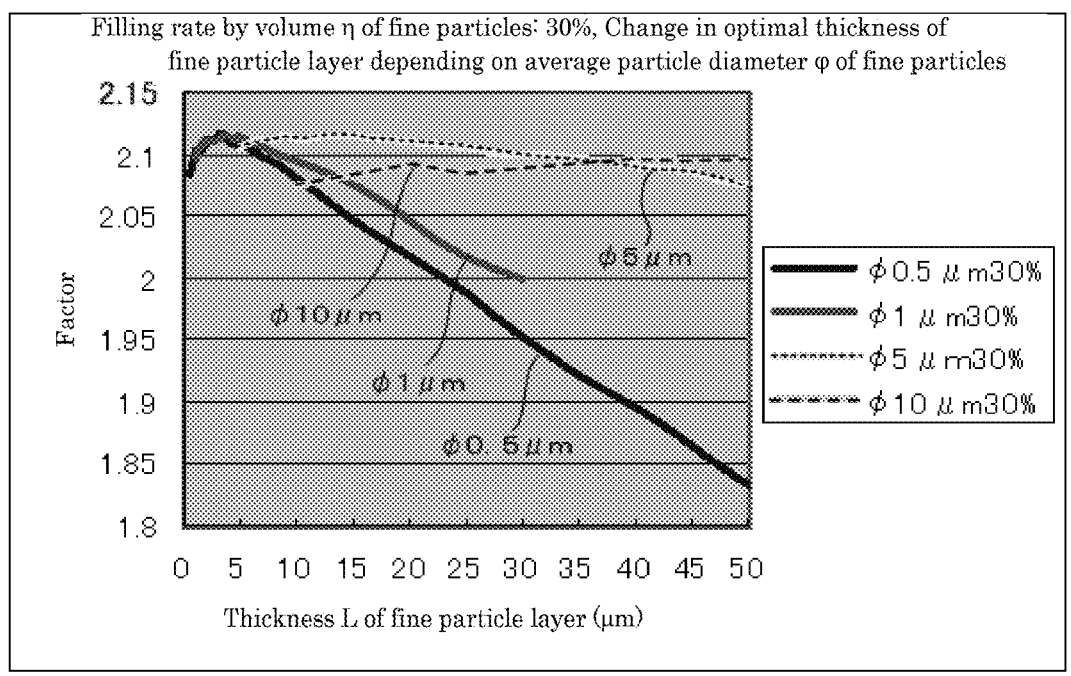
FIG. 7 is a graph of the relationship between thickness of a fine particle layer and increase factor of light extraction efficiency when the filling rate by volume of fine particles is 30% in Example 2.
Figure 8:
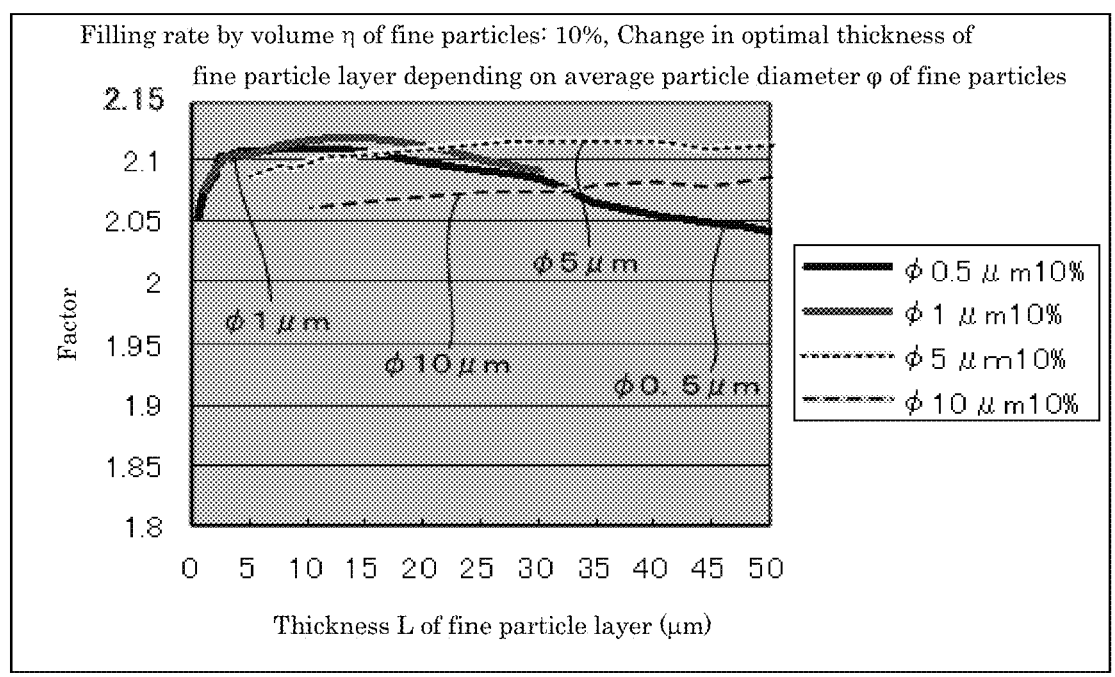
FIG. 8 is a graph of the relationship between thickness of a fine particle layer and increase factor of light extraction efficiency when the filling rate by volume of fine particles is 10% in Example 2.

From the results of FIGS. 6 to 8, it is preferable that the average particle diameter φ of the fine particles is 0.5 μm to 10 μm, the filling rate by volume η of the fine particles is 10% to 50% and the thickness L of the fine particle layer is 1 μm to 50 μm. It is more preferable that the fine particles is more preferably 0.5 μm to 5 μm, the filling rate by volume η of the fine particles is preferably 10% to 50% and the thickness L of the fine particle layer is preferably 1 μm to 30 μm. Within this range, it is possible to form an optimal light distribution-converting member of the low filling rate by volume of the fine particles and the thin fine particle layer. In the case of the low filling rate by volume of the fine particles and the thin fine particle layer, the fine particles aggregate to less extent and also the cost is low.

From the above results, it has been found that optimal conditions when the light distribution-converting member and the light-extracting member are separate layers are that the average particle diameter φ of the fine particles is 1 μm, the filling rate by volume η of the fine particles is 10%, the thickness L of the fine particle layer is 15 μm, the prism height D is 0.1 mm and the prism width W is 0.2 mm.

Example 3

—Production of an Organic Electroluminescent Device—

An organic electroluminescent device of Example 3 illustrated in FIG. 9 was produced in the following manner.

First, a glass substrate (product of Corning Incorporated, Eagle XG, refractive index: 1.51) was placed in a washing vessel and ultrasonically washed in a neutral detergent. Then, the glass substrate was ultrasonically washed in pure water and dried with heating at 120° C. for 120 min.

Next, ITO (Indium Tin Oxide) was deposited on the glass substrate by a sputtering method so as to have a thickness of 100 nm.

Next, 4,4',4''-tris(N,N-(2-naphthyl)-phenylamino)triphenylamine (2-TNATA) expressed by the following structural formula and F4-TCNQ expressed by the following structural formula were deposited on the ITO through co-evaporation to form a 150 nm-thick hole-injecting layer where 2-TNATA was doped with F4-TCNQ in an amount of 0.3% by mass.

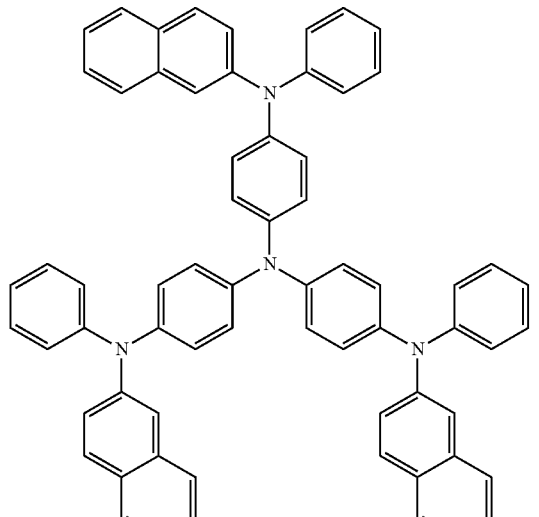

2-TNATA

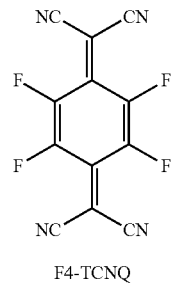

F4-TCNQ

Next, α-NPD (Bis[N-(1-naphthyl)-N-phenyl]benzidine) was deposited on the hole-injecting layer by a vacuum vapor deposition method to form a hole-transporting layer having a thickness of 7 nm.

Next, organic material A expressed by the following structural formula was deposited on the hole-transporting layer by a vacuum vapor deposition method to form a second hole-transporting layer having a thickness of 3 nm.

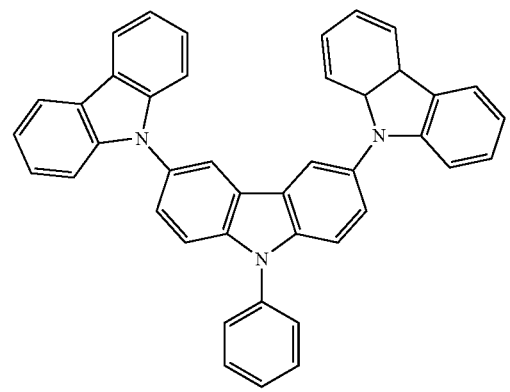

Organic material A

Next, organic material B expressed by the following structural formula serving as a host material and light-emitting material A expressed by the following structural formula serving as a phosphorescent material were deposited on the second hole-transporting layer to form a 30 nm-thick light-emitting layer where the organic material B was doped with the light-emitting material A in an amount of 40%.

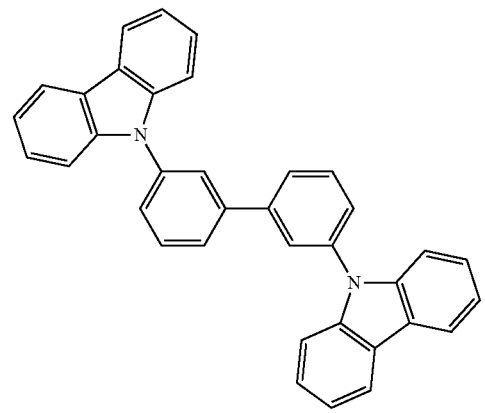

Organic material B

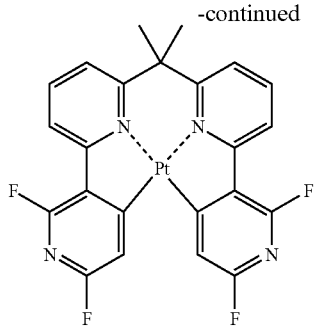

Light-emitting material A

Next, BAlq (Bis-(2-methyl-8-quinolinolato)-4-(phenyl-phenolate)-aluminium(III)) expressed by the following structural formula was deposited through vacuum vapor deposition on the white light-emitting layer to form an electron-transporting layer having a thickness of 39 nm.

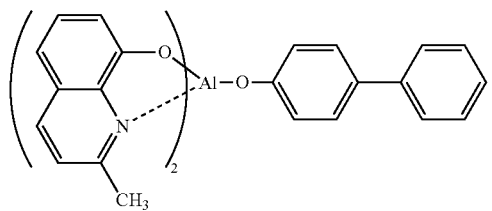

BAlq

Next, BCP (2,9-dimethyl-4,7-diphenyl-1,10-phenanthroline) expressed by the following structural formula was vapor-deposited on the electron-transporting layer to form an electron-injecting layer having a thickness of 1 nm.

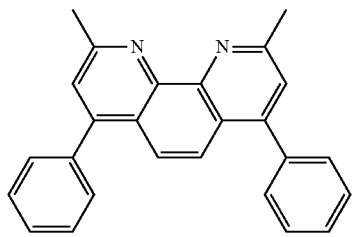

BCP

Next, LiF was vapor-deposited on the electron-injecting layer to form a buffer layer having a thickness of 1 nm, and aluminum was vapor-deposited on the buffer layer to form an electrode layer having a thickness of 100 nm, whereby a laminate was produced.

The produced laminate was transferred from the vacuum state to a room having a nitrogen atmosphere, and sealed by a seal can. Note that, a hygroscopic material had previously been attached to the interior of the seal can.

Next, a united layer of a prism layer and a fine particle layer was formed in the following manner on a surface of the glass substrate which had not been provided with the light-emitting layer, etc. Through the above procedure, an organic electroluminescent device of Example 3 illustrated in FIG. 9 was produced.

<Formation of a United Layer of a Prism Layer and a Fine Particle Layer>

A prism array was formed by an imprint method. First, an imprint material was prepared by dispersing, in a UV imprint resin (product of Toyo Gosei CO., Ltd., PAC-02), $TiO_2$ ultra fine particles (product of ISHIHARA SANGYO KAISHA, LTD., TTO-51(A), average particle diameter: 15 nm) as ultra fine particles, and polystyrene scattering particles (product of JSR Corporation, STADEX SC-200-S, average particle diameter: 2 μm). Then, a silica mold the surface of which had been provided with a releasing agent (product of DAIKIN INDUSTRIES, LTD., OPTOOL-DSX) was used to perform UV imprinting. Through the above procedure, a united layer of a prism layer and a fine particle layer was formed.

The prism height D thereof was 0.05 mm and the prism width W thereof was 0.1 mm. Note that, the surface of the silica mold had been provided with a concavo-convex pattern corresponding to the prism height D and the prism width W.

Example 4

—Production of Organic Electroluminescent Device—

An organic electroluminescent device of Example 4 illustrated in FIG. 10 was produced in the same manner as in Example 3 except that a fine particle layer and a prism layer were formed on a surface of the glass substrate which had not been provided with the light-emitting layer, etc.

<Formation of a Fine Particle Layer>

A dispersion was prepared by dispersing, in a UV imprint resin (product of Toyo Gosei CO., Ltd., PAC-02), $TiO_2$ ultra fine particles (product of ISHIHARA SANGYO KAISHA, LTD., TTO-51(A), average particle diameter: 15 nm) as ultra fine particles, and polystyrene scattering particles (product of JSR Corporation, STADEX SC-200-S, average particle diameter: 2 μm). The thus-prepared dispersion was coated on the glass substrate through slit coating. Through the above procedure, a fine particle layer having a thickness of 15 μm was formed.

<Formation of a Prism Layer>

A prism array was formed by an imprint method. First, an imprint material was prepared by dispersing, in a UV imprint resin (product of Toyo Gosei CO., Ltd., PAC-02), $TiO_2$ ultra fine particles (product of ISHIHARA SANGYO KAISHA, LTD., TTO-51(A), average particle diameter: 15 nm) as ultra fine particles. Then, a silica mold the surface of which had been provided with a releasing agent (product of DAIKIN INDUSTRIES, LTD., OPTOOL-DSX) was used to perform UV imprinting. Through the above procedure, a prism layer was formed.

The prism height D thereof was 0.05 mm and the prism width W thereof was 0.1 mm. Note that, the surface of the silica mold had been provided with a concavo-convex pattern corresponding to the prism height D and the prism width W.

INDUSTRIAL APPLICABILITY

The organic electroluminescent device of the present invention is excellent in external extraction efficiency of emitted light and able to achieve reduced consumption power and long service life, and thus can be suitably used in various fields, such as various lights, computers, displays for automobiles, outdoor displays, domestic and commercial devices, domestic appliances, transportation-related displays, clock displays, calendar displays, luminescent screens and audio devices.

REFERENCE SINGS LIST

2 Organic electroluminescent layer
3 Fine particle layer
4 Transparent substrate
5 Transparent electrode
6 Composite reflective layer
7 Effective light-emitting region
11 Reflective electrode
12 Seal can
20 Organic electroluminescent device
30 Organic electroluminescent device
101 Reflective electrode
102 Organic electroluminescent layer
103 Transparent substrate
104 Second light-transmitting layer
105 First light-transmitting layer
106 Fine concavo-convex structure
107 Lens
108 Prism
109 Fine particle layer

The invention claimed is:

1. An organic electroluminescent device comprising, in an order mentioned:
a reflective electrode;
an organic electroluminescent layer;
a transparent substrate; and
a light-extracting unit,
wherein the light-extracting unit comprises a light-extracting member and a light distribution-converting member, wherein the light-extracting member comprises a prism layer formed of a prism or of a prism array, and wherein the light distribution-converting member comprises fine particles having a refractive index between 1.55 and 2.6 and a polymer having a refractive index between about 1.55 and 1.95;
wherein the fine particles have an average diameter of about 1 µm;
wherein the filling rate by volume of fine particles is about 0.5%;
wherein a prism width of the prism or prism array is about 0.2 mm; and
wherein a prism height of the prism or prism array is in the range of 0.3 mm to 1 mm.

2. The organic electroluminescent device according to claim 1, wherein the number of interfaces where total internal reflection occurs is one.

3. The organic electroluminescent device according to claim 1, wherein the reflective electrode is formed of silver.

4. The organic electroluminescent device of claim 1, wherein the fine particles comprise an oxide or sulfide of an element selected from the group consisting of Al, Ti, Zr, Ta, In, Nd, Sn, Sb, Zn, La, W, Ce, Nb, V, Sm and Y.

5. The organic electroluminescent device of claim 4, wherein the fine particles comprise a material selected from the group consisting of $ZrO_2$, $TiO_2$, $Al_2O_3$, $In_2O_3$, ZnO, $SnO_2$ and $Sb_2O_3$.

6. The organic electroluminescent device of claim 5, wherein the material is selected from the group consisting of $TiO_2$, $ZrO_2$, ZnO and $SnO_2$.

7. The organic electroluminescent device of claim 1, wherein the fine particles have a crystalline structure selected from the group consisting of a rutile structure, a rutile/anatase mixed crystal, or an anatase structure.

8. The organic electroluminescent device of claim 1, wherein the fine particles are subjected to a surface treatment.

9. The organic electroluminescent device of claim 1, wherein the refractive index of the fine particles is between 1.58 and 2.1.

10. The organic electroluminescent device of claim 1, wherein the fine particles have a shape selected from the group consisting of a rice shape, a spherical shape, a cubic shape, a spindle shape or an amorphous shape.

11. The organic electroluminescent device of claim 1, wherein the light-extracting member and the light distribution-converting member are separate structures within the light-extracting unit.

12. The organic electroluminescent device of claim 1, wherein the light-extracting member and the light distribution-converting member are united in a single structure within the light-extracting unit.

13. The organic electroluminescent device of claim 1, wherein the organic electroluminescent layer has a thickness of between 1 nm and 5 µm.

14. The organic electroluminescent device of claim 13, wherein the organic electroluminescent layer has a thickness of between 5 nm and 1 µm.

15. The organic electroluminescent device of claim 14, wherein the organic electroluminescent layer has a thickness of between 10 nm and 500 nm.

16. The organic electroluminescent device of claim 1, wherein the transparent substrate comprises a material selected from the group consisting of ITO, IZO, ZnO, $SnO_2$, $In_2O_3$, and $TiO_2$.

17. The organic electroluminescent device of claim 1, further comprising a barrier layer.

18. The organic electroluminescent device of claim 1, wherein the polymer comprises a thermoplastic resin selected from the group consisting of a polystyrene resin, a polyester resin, a cellulose, a polyether resin, a vinyl chloride resin, a vinyl acetate resin, a vinyl chloride-vinyl acetate copolymer, a polyacryl resin, a polymethacryl resin, a polyolefin resin, a urethane resin, a silicone resin and an imide resin.

19. The organic electroluminescent device of claim 1, wherein the polymer comprises a reactive curable resin.

20. The organic electroluminescent device of claim 1, wherein the polymer comprises a UV imprint resin and the particles comprise $TiO_2$.

* * * * *